United States Patent
Abe et al.

(10) Patent No.: US 10,475,939 B2
(45) Date of Patent: Nov. 12, 2019

(54) TRANSPARENT CONDUCTIVE OXIDE FILM, PHOTOELECTRIC CONVERSION ELEMENT, AND METHOD FOR PRODUCING PHOTOELECTRIC CONVERSION ELEMENT

(71) Applicant: SUMITOMO METAL MINING CO., LTD., Tokyo (JP)

(72) Inventors: Yoshiyuki Abe, Ichikawa (JP); Yasunori Yamanobe, Ome (JP); Riichiro Wake, Ome (JP); Masakazu Kuwahara, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 15/736,985

(22) PCT Filed: May 17, 2016

(86) PCT No.: PCT/JP2016/064656
§ 371 (c)(1),
(2) Date: Dec. 15, 2017

(87) PCT Pub. No.: WO2016/208297
PCT Pub. Date: Dec. 29, 2016

(65) Prior Publication Data
US 2018/0175224 A1    Jun. 21, 2018

(30) Foreign Application Priority Data
Jun. 26, 2015    (JP) .................................. 2015-128726

(51) Int. Cl.
*H01L 31/0224*    (2006.01)
*H01L 31/18*    (2006.01)
(Continued)

(52) U.S. Cl.
CPC ...... *H01L 31/022475* (2013.01); *C23C 14/08* (2013.01); *C23C 14/086* (2013.01);
(Continued)

(58) Field of Classification Search
CPC ......... H01L 31/1884–1888; H01L 31/022475; H01L 31/022425; H01L 51/442–445; H02S 40/30–38; C23C 14/08
See application file for complete search history.

(56) References Cited

U.S. PATENT DOCUMENTS

2015/0311361 A1    10/2015    Sogabe et al.
2015/0311362 A1*   10/2015    Sogabe ................. C23C 14/086
                                                                136/256

FOREIGN PATENT DOCUMENTS

JP    06-338624 A    12/1994
JP    2003-115599 A    4/2003
(Continued)

OTHER PUBLICATIONS

International Search Report dated Aug. 16, 2016, issued for PCT/JP2016/064656.

*Primary Examiner* — Tucker J Wright
(74) *Attorney, Agent, or Firm* — Locke Lord LLP; James E. Armstrong, IV; Nicholas J. DiCeglie, Jr.

(57) ABSTRACT

Provided is a photoelectric conversion element comprising ITiO as a transparent electrode that is formed using an inline-type sputtering method, and utilizing the high transmittance up to the near-infrared ray region and excellent conductivity of ITiO. Using the inline-type sputtering method, a first transparent conductive oxide film 8 comprising indium oxide or tin-containing indium oxide that includes indium oxide as a main component and tin at an atomic ratio Sn/(In+Sn) of 19 atomic % or less is formed on a photoelectric conversion layer 7 side, and a second transparent conductive oxide film 9 comprising a titanium-
(Continued)

containing indium oxide that includes indium oxide as a main component, and titanium at an atomic ratio Ti/(In+Ti) of 0.5 atomic % to 3.5 atomic % is laminated on an opposite side of the first transparent conductive film 8 from the photoelectric conversion layer 7.

9 Claims, 6 Drawing Sheets

(51) Int. Cl.
     *H01L 31/075*     (2012.01)
     *C23C 14/08*      (2006.01)
     *C23C 14/35*      (2006.01)

(52) U.S. Cl.
     CPC .... *C23C 14/352* (2013.01); *H01L 31/022425* (2013.01); *H01L 31/075* (2013.01); *H01L 31/1884* (2013.01); *Y02E 10/50* (2013.01); *Y02P 70/521* (2015.11)

(56) References Cited

FOREIGN PATENT DOCUMENTS

| | | |
|---|---|---|
| JP | 2004-207221 A | 7/2004 |
| JP | 2012-129475 A | 7/2012 |
| JP | 2013-131560 A | 7/2013 |
| WO | 2013/094403 A1 | 6/2013 |
| WO | WO 2014/073328 A1 * | 5/2014 |
| WO | 2014/087741 A1 | 6/2014 |

* cited by examiner

SOLAR LIGHT

TRANSPARENT CONDUCTIVE OXIDE FILM, PHOTOELECTRIC CONVERSION ELEMENT, AND METHOD FOR PRODUCING PHOTOELECTRIC CONVERSION ELEMENT

TECHNICAL FIELD

The present invention relates to a photoelectric conversion element, a transparent conductive oxide film that is used as a transparent electrode of the photoelectric conversion element, and a method for producing the photoelectric conversion element that includes the transparent electrode that is made using the transparent conductive oxide film.

BACKGROUND ART

A transparent conductive film has high conductivity and high light transmittance in the visible light region, so is used as a transparent electrode of various kinds of photoelectric conversion elements including solar cells, liquid-crystal display elements, and various other kinds of light receiving elements. Moreover, transparent conductive film has excellent reflection absorption characteristics in the near-infrared ray region, so transparent conductive film is also used as heat-ray reflection film, various kinds of antistatic film, transparent heating elements for defogging freezer showcases, and the like.

As material for this kind of transparent conductive film, typically tin oxide ($SnO_2$) that includes antimony, fluorine or the like as a dopant, zinc oxide (ZnO) that includes aluminum, gallium, indium, tin or the like as a dopant, indium oxide ($In_2O_3$) that includes tin, tungsten, titanium or the like as a dopant, and the like are used. Particularly, indium oxide film that includes tin as a dopant (ITO) is such that a transparent conductive film having low resistance can be easily obtained, so is widely used industrially.

As a method for producing this kind of transparent conductive oxide film, a sputtering method, a vapor deposition method, an ion plating method, a coating method using a coating solution for forming a transparent conductive film, and the like are used. Particularly, the sputtering method and ion plating method are useful in the case of forming a film on a substance such as a substrate on which the film is to be formed using a material low in vapor pressure, or for uses when precise film thickness control is necessary, and is also widely used because operation is extremely convenient.

The sputtering method is a method in which typically argon plasma is generated in an argon gas atmosphere at a pressure of approximately 10 Pa or less by causing a glow discharge between a substrate as an anode and a target as a cathode, then causing collisions between the argon cations in the plasma and the target, causing the particles of the target component be sputtered off and the sputtered particles to be deposited on the substrate to form a film.

The sputtering method is classified by the method for generating argon plasma, and there is a high-frequency sputtering method that uses high-frequency plasma, and a direct-current sputtering method that uses direct-current plasma. Moreover, a magnetron sputtering method is also used in which a film is formed by arranging a magnet unit on the back side of the target, causing argon plasma to be concentrated directly above the target, and increasing the collision efficiency of argon ions even at low gas pressure.

Of these, normally a direct-current magnetron sputtering method is used for producing a transparent conductive oxide film. Moreover, a high-frequency superimposed direct-current sputtering method that uses a direct-current plasma as a base may be used. This high-frequency superimposed direct-current sputtering method makes it possible to perform sputtering at a low discharge voltage, which makes it possible to obtain a good quality film by reducing collisions on the film due to oxygen ions generated from the target, so this method is used when producing an oxide film using an oxide target.

Furthermore, film formation by the sputtering method can be largely divided into a stationary facing target type sputtering method, and an inline-type sputtering method. The stationary facing target type sputtering method is a method in which inside a vacuum film formation chamber, a substrate moves to a position directly above a target and stops, then plasma is generated over the target and film formation is performed for a set about of time, and at the instant that a film having a specified film thickness is formed, electric discharge is stopped, and the substrate is moved away from the target.

On the other hand, the inline-type sputtering method is a method for forming a film on a substrate by continuously generating and maintaining argon plasma over a target in a vacuum film formation chamber, conveying the substrate closer to the target at a constant moving speed, and passing the target without stopping. In this case, the film thickness of the thin film that is obtained is controlled by the electric power inputted to the target and by the conveying speed. This kind of inline-type sputtering method is capable of uniformly forming a film over a large surface area, so it is the most widely used industrially.

This kind of transparent conductive oxide film is widely used as a transparent electrode of a photoelectric conversion element such as that of a solar cell and the like. Solar cells that are a kind of photoelectric conversion element are configured having a layered structure of p-type and n-type semiconductors, and are largely divided according to the type of semiconductor that is used. Normally, safe and richly abundant silicon is used as the semiconductor material for a solar cell. As silicon type solar cells there are single-crystal silicon solar cells, polycrystalline silicon solar cells, amorphous thin-film silicon solar cells, hybrid solar cells that are a combination of amorphous thin-film silicon and single-crystal silicon, and the like. Moreover, development of compound thin-film solar cells that use a thin film of a compound semiconductor such as $CuInSe_2$, GaAs, CdTe and the like as a semiconductor material is being performed.

Amorphous thin-film silicon solar cells, hybrid solar cells, and compound thin-film solar cells are such that the use of transparent conductive oxide film as an electrode on the side solar light enters into the solar cell is necessary. As this kind of transparent conductive oxide film, ITO film, and aluminum or gallium-doped ZnO film are used (refer to JPH06338624 (A), and JP2003115599 (A)).

The transparent conductive oxide film that is used as a transparent electrode for a solar cell is required to have characteristics such as low resistance and high transmittance of solar light. The spectrum of solar light includes from 350 nm ultraviolet rays to 2500 nm infrared rays, and so as to be able to effectively convert this light energy to electric energy, a transparent conductive oxide film that is able to transmit light in as wide a wavelength range as possible is required. As a transparent conductive oxide film having such characteristics, JP2004207221(A), for example, discloses a transparent conductive oxide film that, is made using a titanium-containing indium oxide (ITiO) of which part of the indium is replaced with titanium, has high transmittance in a wide range from the visible-light region to the near-infrared ray region, and has excellent conductivity.

In the technology disclosed in JP2004207221(A), the transparent conductive oxide film is formed using a sputtering method or an ion plating method. Of these, when using a sputtering method, an ITiO sintered body target is used as the raw material sputtering target, and using a stationary facing target sputtering method in which the substrate and target are placed inside a sputtering apparatus, and in an argon inert gas atmosphere that includes oxygen gas, the substrate is heated to a specified temperature, an electric field is applied between the substrate and the target to generate plasma between the target and substrate, and an ITiO transparent conductive oxide film is formed on the substrate.

On the other hand, in the case of using an ion-plating method, an ITiO sintered body tablet is used as a raw material ion-plating tablet, the substrate is placed inside the ion-plating apparatus, the tablet is placed inside a copper hearth inside that ion-plating apparatus, and in an argon inert gas atmosphere that includes oxygen gas, the substrate is heated to a specified temperature, the tablet is evaporated from the copper hearth using an electron gun, plasma is generated near the substrate, and by ionizing the tablet vapor, an ITiO transparent conductive oxide film is formed on the substrate.

However, with these methods, when an ITiO film is formed on a substrate that will become a photoelectric conversion layer of a photoelectric conversion element such as a solar cell, depending on the film formation conditions, the characteristics of the photoelectric conversion element may not be sufficiently exhibited. Particularly, in the case of forming an ITiO film using an inline-type sputtering method that is widely used industrially, the characteristics of the ITiO film are not utilized, and it becomes remarkably evident that the characteristics of the photoelectric conversion element become insufficient.

RELATED LITERATURE

Patent Literature

[Patent Literature 1] JPH06338624 (A)
[Patent Literature 2] JP2003115599 (A)
[Patent Literature 3] JP2004207221 (A)

SUMMARY OF INVENTION

Problem to be Solved by Invention

Taking the above situation into consideration, the object of the present invention is to provide a transparent conductive oxide film that has excellent characteristics as a transparent electrode of a photoelectric conversion element such as a solar cell while taking advantage of ITiO film having a high transmittance up to the near-infrared ray region and good conductivity without being influenced by film forming conditions, and a highly efficient photoelectric conversion element that uses this transparent conductive oxide film as a transparent electrode, stably and at low cost using an industrially useful inline-type sputtering method.

Means for Solving Problems

A feature of the present invention is a transparent conductive oxide film that is used as a transparent electrode in a photoelectric conversion element such as a solar cell and the like that includes at least a photoelectric conversion layer and the transparent electrode; the transparent conductive oxide film comprising a layered film that includes an indium oxide film (IO) or a tin-containing indium oxide (ITO) film, and a titanium-containing indium oxide (ITiO) film.

More specifically, the layered film includes: a first transparent conductive oxide film comprising an indium oxide or a tin-containing indium oxide that includes indium oxide as a main component and tin at an atomic ratio Sn/(In+Sn) of 19 atomic % or less, the first transparent conductive oxide film being formed on the photoelectric conversion layer side; and a second transparent conductive oxide film comprising a titanium-containing indium oxide that includes indium oxide as a main component and titanium at an atomic ratio Ti/(In+Ti) of 0.5 atomic % to 3.5 atomic %, the second transparent conductive oxide film being layered on an opposite side of the first transparent conductive oxide film from the photoelectric conversion layer.

Preferably, the film thickness of the first transparent conductive oxide film is within the range 3 nm to 60 nm, and the film thickness of the overall layered film is within the range 70 nm to 140 nm.

Preferably, both the first transparent conductive oxide film and second transparent conductive oxide film are crystalline films.

Preferably, the first transparent conductive oxide film and second transparent conductive oxide film are formed by a sputtering method, and particularly by an inline-type sputtering method.

The photoelectric conversion element of the present invention, and particularly a solar cell, includes at least a photoelectric conversion layer and a transparent electrode, and the transparent conductive oxide film according to the present invention is used as the transparent electrode.

Preferably, a silicon type semiconductor or a compound semiconductor is used in the photoelectric conversion layer.

Moreover, the present invention relates to a method for manufacturing a photoelectric conversion element such as a solar cell and the like that includes at least a photoelectric conversion layer and transparent electrode. Particularly, one embodiment of a method for manufacturing the photoelectric conversion element of the present invention includes processes of:

conveying the photoelectric conversion layer as a substrate;

using an inline-type sputtering method to form a first transparent conductive oxide film comprising an indium oxide or a tin-containing indium oxide that includes indium oxide as a main component and tin at an atomic ratio Sn/(In+Sn) of 19 atomic % or less on the photoelectric conversion layer during being conveyed as the substrate;

using an inline-type sputtering method to form a second transparent conductive oxide film comprising a titanium-containing indium oxide that includes indium oxide as a main component and titanium at an atomic ratio Ti/(In+Ti) of 0.5 atomic % to 3.5 atomic % on top of the first transparent conductive oxide film that is formed on the photoelectric conversion layer during being conveyed as the substrate; and obtaining the photoelectric conversion element in which a layered film that includes the first transparent conductive oxide film that is formed on the photoelectric conversion layer side, and the second transparent conductive oxide film that is formed on top of the first transparent conductive oxide film is formed as the transparent electrode.

Moreover, another embodiment of a method for manufacturing a photoelectric conversion element such as a solar cell and the like, is a method for manufacturing a photoelectric conversion element that further includes a transparent substrate, and includes steps of:

conveying the transparent substrate;

using an inline-type sputtering method to form a second transparent conductive oxide film comprising a titanium-containing indium oxide that includes indium oxide as a main component and titanium at an atomic ratio Ti/(In+Ti) of 0.5 atomic % to 3.5 atomic % on the transparent substrate during being conveyed;

using an inline-type sputtering method to form a first transparent conductive oxide film that is indium oxide or a tin-containing indium oxide that includes indium oxide as a main component and tin at an atomic ratio Sn/(In+Sn) of 19 atomic % or less on the second transparent conductive oxide film that is formed on the transparent substrate during being conveyed;

forming a photoelectric conversion layer on top of the first transparent conductive oxide film; and obtaining the photoelectric conversion element in which a layered film that includes the first transparent conductive oxide film that is formed on the photoelectric conversion layer side, and the second transparent conductive oxide film that is laminated on an opposite side of the first transparent conductive oxide film from the photoelectric conversion layer is formed as the transparent electrode.

EFFECT OF INVENTION

With the present invention, even in the case of using an inline-type sputtering method under typical sputtering conditions, oxygen is not excessively incorporated more than an optimal amount during flight of the sputtered particles, and an ITiO film having inferior conductivity is not formed on the surface of a photoelectric conversion layer that is conveyed as a substrate. Therefore, the layered film as a whole, having an ITiO film, sufficiently exhibits good conductivity and high transparency over wide range up to the near-infrared ray region. By using the transparent conductive oxide film of the present invention as a transparent electrode, it is possible to provide a photoelectric conversion element such as a highly efficiently solar cell that utilizes the characteristics of ITiO film. Moreover, by using an inline-type sputtering method, it becomes possible to stably supply this kind of highly efficient photoelectric conversion element at low cost.

In this way, the present invention not only contributes greatly to the productivity of photoelectric conversion elements including solar cells, but also to the improvement of performance of such photoelectric conversion elements, and can be said to have an extremely high industrial value.

MODES FOR CARRYING OUT INVENTION

The inventors diligently investigated the problem of not being able to sufficiently exhibit the characteristic of achieving a high transmittance over a wide wavelength range particularly when a titanium-containing indium oxide (ITiO) film is used as a transparent electrode, even when in a photoelectric conversion element such as a solar cell this ITiO film has excellent conductivity. In other words, the inventors investigated the relationship between the film formation conditions for forming ITiO film using an industrially useful inline-type sputtering method and the problem above, and then considered the formation conditions and structure of the transparent electrode in detail to make it possible to maximize the performance of a photoelectric conversion element that uses ITiO film that is formed using an inline-type sputtering method as a transparent electrode. As a result, it was learned that by using a layered transparent conductive oxide film of which the ITiO film is formed after forming an indium oxide (IO) film or a tin-containing indium oxide (ITO) film on top of a photoelectric conversion layer rather than forming an ITiO film directly on top of the photoelectric conversion layer of a photoelectric conversion element, it is possible to stably produce a highly efficient photoelectric conversion element, and particularly a solar cell, independent of the sputtering conditions, and this led to the completion of the present invention.

1. Inline-Type Sputtering Method

First, the relationship between the inline-type sputtering method that is suitably used in order to form the transparent conductive oxide film of the present invention, and the characteristics of the ITiO film that uses this inline-type sputtering method will be explained as the premise of the present invention.

Figure 1:
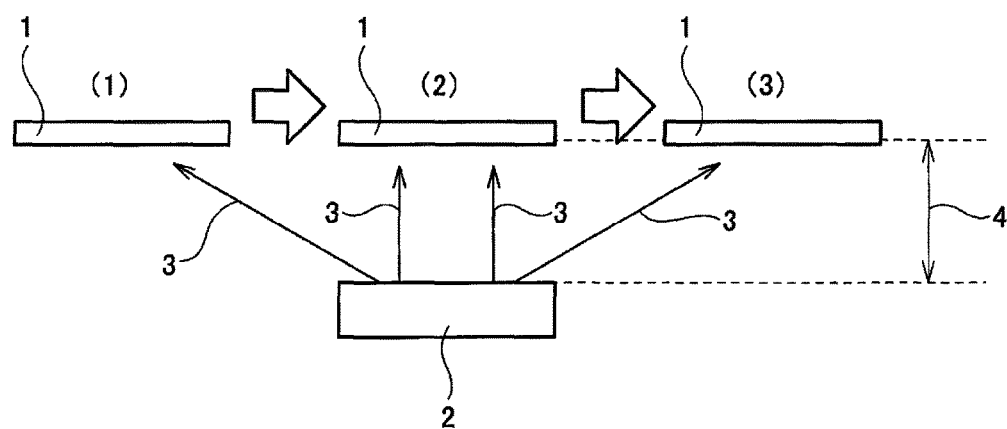
FIG. 1 is a schematic diagram for explaining the inline-type sputtering method to which the present invention is applied.

An inline-type sputtering method is a method for forming film in which, as illustrated in FIG. 1, while a substrate 1 is conveyed in a specified conveying direction under an argon gas pressure of approximately 10 Pa or less, and with this substrate 1 taken to be the cathode and a target 2 taken to the anode, argon plasma is generated by causing a glow discharge to occur between the substrate 1 and the target 2, causing argon cations inside the plasma to collide with the target 2, which causes component particles to sputter off from the target 2 as sputtered particles 3, and these sputtered particles 3 are accumulated on the substrate 1 which is passing over the target 2. Normally, in order to obtain a specified film thickness, a glow discharge is caused to occur with plural targets 2 arranged side by side, and film formation is performed by passing the substrate 1 over the plural targets 2 while conveying the substrate 1 in a specified conveying direction.

In the inline-type sputtering method, not only the position (2) where the substrate 1 is directly above the target 2, but also at position (1) and position (3) where the substrate 1 is located apart from position (2), the sputtered particles 3 that fly in a diagonal direction from the target 2 are accumulated. At position (1) and position (3), the distance that the sputtered particles 3 fly becomes longer when compared with film formation at position (2) directly above the target 2. Particularly, at position (1), sputtered particles 3 that arrive at the surface of the substrate after flying long distance are first accumulated.

When forming an indium oxide type film using a sputtering method, a sintered body target of these oxides and a sputtering gas that is obtained by mixing argon and a minute amount of oxygen are used. By precisely controlling the amount of oxygen that is mixed with argon, the optimum amount of oxygen or the optimum amount of oxygen deficiency in the film is controlled, so adjustment of the sputtering gas is an essential point that affects the conductivity of the obtained film. In most cases, the form of the sputtered particles is atomic. In other words, in sputtering film formation that uses an ITO sintered body target, the sputtered particles include indium (In), tin (Sn) and oxygen (O), and in sputtering film formation that uses an ITiO sintered body target, the sputtered particles include indium, titanium and oxygen.

These sputtered particles may collide with argon and oxygen of the sputtering gas during flight before arriving at the substrate. The frequency of collisions between sputtered particles and the sputtering gas increases the higher the gas pressure is, and the longer the distance between the target and the substrate is. Compared with indium and tin, titanium has strong coupling with oxygen, so titanium particles are easily oxidized by colliding with oxygen. Therefore, when forming ITiO film using a sputtering method, the titanium particles are oxidized by colliding with oxygen in the sputtering gas, and film is formed in that state, so oxygen is easily incorporated into the film.

As can be understood from FIG. 1, normally, the distance 4 between the target and the substrate means the shortest distance between the target 2 and the substrate 1 when the substrate 1 comes directly above the target 2.

In inline-type sputtering, film formation at position (1) and position (3) is such that sputtered particles 3 fly through a longer distance than the distance 4 between the target and substrate before arriving at the substrate 2, so the amount of oxygen that is incorporated into the film due to oxidation of the sputtered particles 3 that include titanium particles becomes greater than in film formation at position (2).

The amount of accumulation of sputtered particles 3 in the inline-type sputtering method becomes overwhelmingly large at position (2), and becomes less the further away from being directly above the target 2 such as at position (1) and position (3). In the case of both ITO film and ITiO film, film for which both conductivity and transparency become optimum is achieved by controlling the amount of oxygen deficiency in the film, however, that control is performed by controlling the amount of oxygen gas that is mixed in argon gas. In this case, the mixed amount of oxygen gas is controlled so that the characteristics of the film that is formed at position (2) where there is a large amount of accumulation are the best.

However, when a film is formed in a mixed amount of oxygen gas that is optimized at position (2), in the case of ITiO film, the effect of oxidation of the sputtered particles 3 that include titanium particles becomes larger at position (1) and position (3), and there is a strong tendency for a lot of oxygen to be incorporated into the film.

In other words, when performing ITiO film formation on a photoelectric conversion layer of a photoelectric conversion element such as a solar cell using an inline-type sputtering method, at position (1), a ITiO film into which oxygen is incorporated more excessively than the optimum amount and of which conductivity is insufficient is thinly formed on the photoelectric conversion layer, and then an optimum ITiO film is thickly formed thereon. Film having this kind of structure that differs from ideally formed ITiO film is such that the film thickness is thin, however, ITiO film having high resistance covers the top of the photoelectric conversion layer, so it becomes impossible for the charge that is generated in the photoelectric conversion layer to efficiently flow to the electrode. This situation greatly affects the performance of a photoelectric conversion element such as a solar cell and the like, and becomes a cause of not being able to maximize the characteristics of the ITiO film such as high transparency in the near-infrared ray region and good conductivity.

As a result of investigation, it was learned that when the distance 4 between the target and substrate is shortened and the sputtering gas pressure is reduced, there is a tendency for the collisions between titanium and oxygen to decrease and the amount of oxygen that is incorporated into the film at position (1) to be decreased, and therefore the influence on the film characteristics to be reduced. On the other hand, when the distance 4 between the target and substrate is lengthened and the sputtering gas pressure is increased, there is a remarkable tendency that a ITiO film into which oxygen is incorporated more excessively than the optimum amount and of which conductivity is insufficient is formed on the photoelectric conversion layer, and then an optimum ITiO film is thickly formed thereon.

2. Transparent Conductive Oxide Film, Photoelectric Conversion Element, and Method of Producing a Photoelectric Conversion Element of the Present Invention In the following, the transparent conductive oxide film, photoelectric conversion element such as a solar cell, and method of producing a photoelectric conversion element according to the present invention will be explained in detail in that order particularly on the premise that the present invention will be applied to a solar cell. However, the present invention is not limited to a solar cell, and can be suitably applied to various photoelectric conversion elements.

(1) Transparent Conductive Oxide Film

Figure 2:
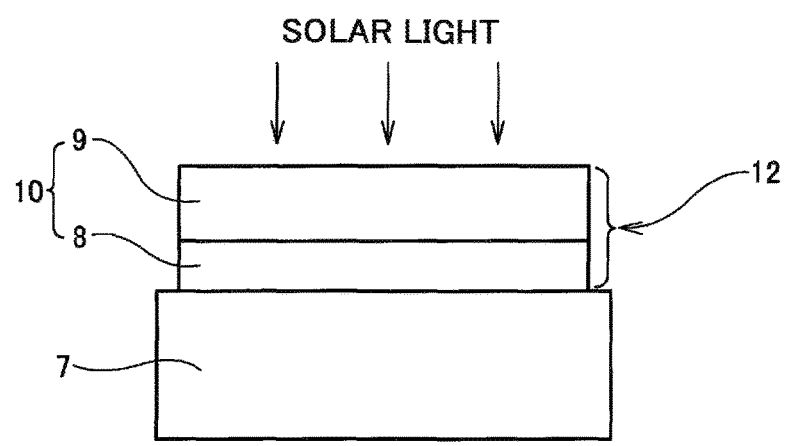
FIG. 2 is a schematic diagram illustrating an example of a photoelectric conversion element of a solar cell in which the layered transparent conductive oxide film of the present invention is used.
Figure 3:
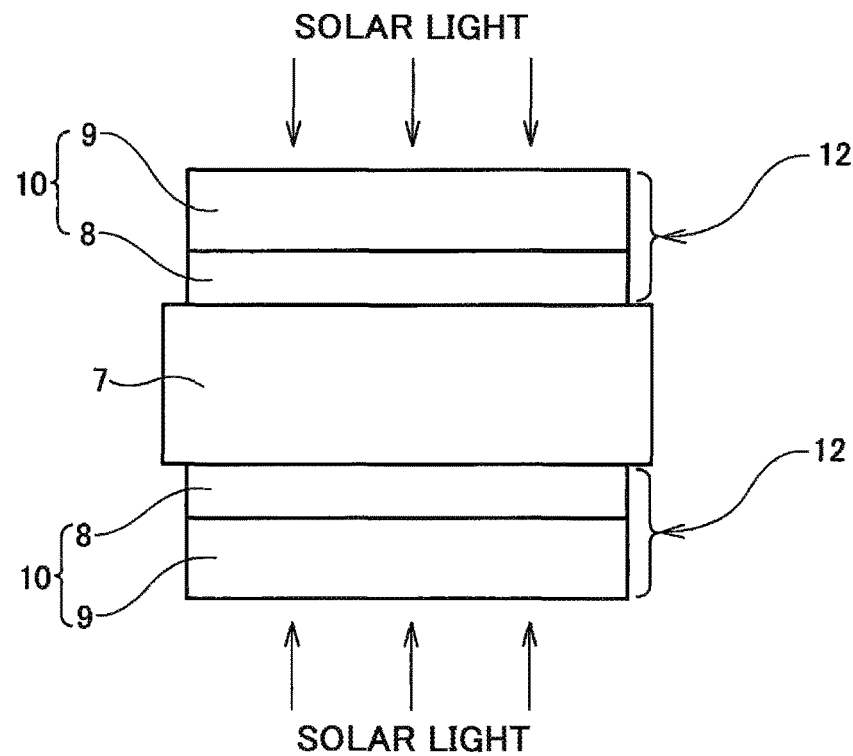
FIG. 3 is a schematic diagram illustrating an example of a photoelectric conversion element of a solar cell that includes a double-sided light-receiving photoelectric conversion layer, and in which the layered transparent conductive oxide film of the present invention is used.

Two examples of a photoelectric conversion element of a solar cell that uses the transparent conductive oxide film (hereafter, referred to as "layered transparent conductive oxide film", or simply referred to as "layered film") according to an embodiment of the present invention as a transparent electrode are illustrated in FIG. 2 and FIG. 3. FIG. 3 is an example of a photoelectric conversion element that includes a double-side light-receiving type photoelectric conversion layer.

The layered transparent conductive oxide film 10 of the present invention is used at least as a photoelectric conversion element that includes at least a photoelectric conversion layer and a transparent electrode, and particularly is used as a transparent electrode in a solar cell. Particularly, the layered film 10 of the present invention has layered structure of a first transparent conductive oxide film 8 and a second transparent conductive oxide film 9, and the first transparent conductive oxide film 8 is formed on the surface of a photoelectric conversion layer 7.

The first transparent conductive oxide film 8 is a film that covers the surface of the photoelectric conversion layer 7. The first transparent conductive oxide film 8 is indium oxide (IO), or is tin-containing indium oxide (ITO) that includes indium oxide as the main component, and includes tin at an atomic ratio Sn/(In+Sn) of 19 atomic % or less.

In ITO film, the reason the amount of tin included is an atomic ratio Sn/(In+Sn) of 19 atomic % or less is that because when the amount of tin included is greater than 19 atomic %, the conductivity of the film worsens. A more preferable composition of the first transparent conductive oxide film 8 is an atomic ratio Sn/(In+Sn) in the range 2.7 atomic % to 12.1 atomic %, and even more preferably within the range 4.1 atomic % to 11.1 atomic %. In this kind of atomic ratio range, the overall conductivity of the layered film 10 is further improved.

The second transparent conductive oxide film 9 includes titanium-containing indium oxide (ITiO) that includes indium oxide as the main component, and includes titanium at an atomic ratio Ti/(In+Ti) of 0.5 atomic % to 3.5 atomic %.

In the second transparent conductive oxide film 9, the reason that the amount of titanium included is in the range of an atomic ratio Ti/(In+Ti) of 0.5 atomic % to 3.5 atomic % is that, when the atomic ratio is less than 0.5 atomic %, the overall conductivity of the layered film 10 worsens, and when the atomic ratio is greater than 3.5 atomic %, the overall conductivity and the transparency in the near-infrared ray region of the layered film 10 worsens. A more preferable composition of the second transparent conductive oxide film 9 is an atomic ratio Ti/(In+Ti) in the range 0.5 atomic % to 2.8 atomic %, and even more preferably within the range 0.7 atomic % to 2.6 atomic %. In this kind of atomic ratio range, the overall conductivity of the layered film 10 is further improved.

The overall film thickness of the layered film 10 of the present invention is arbitrary according to the use, desired performance, structure and the like of the photoelectric conversion element, for example, solar cell, however, normally is preferably within the range 70 nm to 140 nm, and more preferably is within the range 80 nm to 110 nm. When the overall film thickness of the layered film 10 is thinner than 70 nm, the conductivity of the layered film 10 becomes insufficient, so is not able to function sufficiently as a transparent electrode of a photoelectric conversion element, and it becomes impossible to exhibit excellent photoelectric conversion characteristics or solar cell characteristics. On the other hand, when the overall film thickness of the layered film 10 is thicker than 140 nm, the overall transparency of the layered film 10 becomes worse, the amount of solar light entering the photoelectric conversion layer decreases, and it becomes impossible to exhibit excellent photoelectric conversion characteristics.

Moreover, the film thickness of the first transparent conductive oxide film 8 as well is arbitrarily set according to the overall film thickness of the layered film 10, however, is preferably within the range 3 nm to 60 nm, and more preferably is within the range 5 nm to 20 nm. The first transparent conductive oxide film 8 is formed on the photoelectric conversion layer 7 side, so when the film thickness of the first transparent conductive oxide film 8 is thinner than 3 nm, it is not possible to sufficiently cover the surface of the photoelectric conversion layer 7, and the function of giving good conductivity to the entire layered film 10 is not exhibited. On the other hand, when the film thickness of the first transparent conductive oxide film 8 is thicker than 60 nm, the percentage of the range of the overall film thickness of the layered film 10 of 70 nm to 140 nm that is occupied by the first transparent conductive oxide film 8 becomes too large, and the contribution to the photoelectric conversion characteristics by the second transparent conductive oxide film 9 made of ITiO decreases.

The film thickness of the second transparent conductive oxide film 9 is set according to the use, desired performance, structure and the like of the photoelectric conversion element, for example, solar cell, and according to the overall film thickness of the layered film 10 and the film thickness of the first transparent conductive oxide film 8, however, preferably is within the range 10 nm to 137 nm, and more preferably is within the range 60 nm to 110 nm. By being within such a range, the performance of the second transparent conductive oxide film 9 made of ITiO which has high conductivity and transparency in a wide range up to the near-infrared ray region is sufficiently exhibited.

In the layered film 10 of the present invention, both the first transparent conductive oxide film 8 and the second transparent conductive oxide film 9 are preferably crystalline film. Both the first transparent conductive oxide film 8 and the second transparent conductive oxide film 9 being crystalline film means that when the film is observed using a scanning electron microscope or transmission electron microscope no amorphous portion is observed, and all of these films 8 and 9 are composed of crystalline particles. In order to make the first transparent conductive oxide film 8 and the second transparent conductive oxide film 9 crystalline films, the substrate is heated to 150° C. or higher during sputtering film formation, or after film formation at a substrate temperature of 150° C. or less, heat treatment may be performed at a temperature higher than 150° C.

By configuring the first transparent conductive oxide film 8 as a crystalline film, not only is conductivity better than when configured using an amorphous film, but also there is an advantage in that it is possible to exhibit high transmittance in the short wavelength range of visible light having a wavelength of 380 nm to 400 nm.

Moreover, by configuring the second transparent conductive oxide film 9 as a crystalline film, not only is conductivity better than when configured using an amorphous film, but there is an advantage in that it is possible to exhibit high transmittance in the near-infrared ray region having a wavelength of 800 nm to 1200 nm, and the amount of incident light entering the photoelectric conversion layer 7 increases.

In the layered film 10 of the present invention, another transparent conductive film for the purpose of adjusting the light transmittance or adjusting the conductivity may be inserted between the first transparent conductive oxide film 8 that are formed on the photoelectric conversion layer 7 side and the second transparent conductive oxide film 9 within a range so as not to impair the features of the present invention.

As for the other transparent conductive film there is, for example, ITO film having different composition than the first transparent conductive oxide film 8, ITiO film having different composition than the second transparent conductive oxide film 9, tungsten-containing indium oxide film, zirconium-containing indium oxide film, cerium-containing indium oxide film, gallium-containing indium oxide film, IO film that does not include additional elements, zinc oxide film such as gallium and/or aluminum containing zinc oxide film and the like, zinc oxide film that does not include additional elements, titanium oxide film such as niobium-containing titanium oxide film and the like, and niobium oxide film and the like. Moreover, layered film of these transparent conductive oxide film or mixed film that is a combination of plural film combinations may also be employed within a range that does not impair the features of the present invention.

The first transparent conductive oxide film 8 and the second transparent conductive oxide film 9 of the layered film 10 of the present invention, when formed by a sputtering method, sufficiently exhibit of exhibiting high transparency in a wide wavelength range from the visible light range to the near-infrared ray region, while maintaining high conductivity when compared with the case of a transparent electrode that is formed, for example, using only an ITO film or an ITiO film. However, the configuration of the present invention can also be applied to a transparent electrode of a solar cell that is made by using other film formation methods such as an ion-plating method or vapor deposition method, and in this case as well, a first transparent conductive oxide film 8 having excellent conductivity is formed on the surface of the photoelectric conversion layer 7, and it is possible to obtain with the entire transparent electrode a photoelectric conversion element of a solar cell or the like that has both high transparency in the near-infrared ray region and excellent conductivity.

Particularly, when the layered film 10 of the present invention is formed using an inline-type sputtering method, the effect of the present invention of continuously forming film that has both excellent conductivity and transparency on the surface of a photoelectric conversion layer is sufficiently exhibited. In other words, compared with the case of a transparent electrode that is formed by film formation using an inline-type sputtering method and solely ITO film or ITiO film, there is a remarkable operational effect of obtaining a photoelectric conversion element of a solar cell or the like that has both high transparency in the near-infrared ray region and excellent transparency with the entire transparent electrode.

As the target that is used in sputtering formation of the film, it is possible to use either a flat plate shaped target or a cylindrical shaped target (called a rotary cathode), however, the present invention is not limited by the shape and type of target. Moreover, from the aspect of controlling the optimum amount of oxygen deficiency in the film, using an IO sintered body or ITO sintered body, and an ITiO sintered body for the target is preferred.

(2) Photoelectric Conversion Element (Solar Cell)

Figure 4:
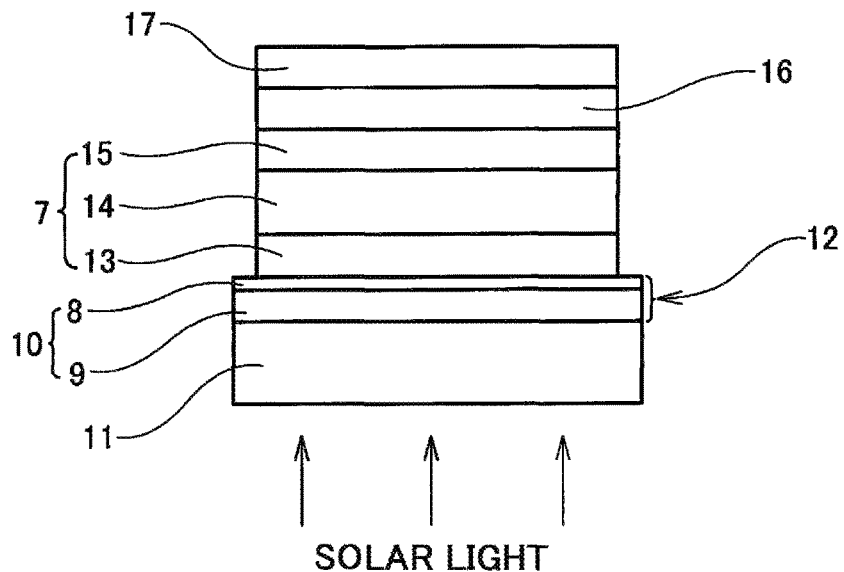
FIG. 4 is a schematic diagram illustrating an example of construction of a thin-film solar cell in which the layered transparent conductive oxide film of the present invention is used.
Figure 5:
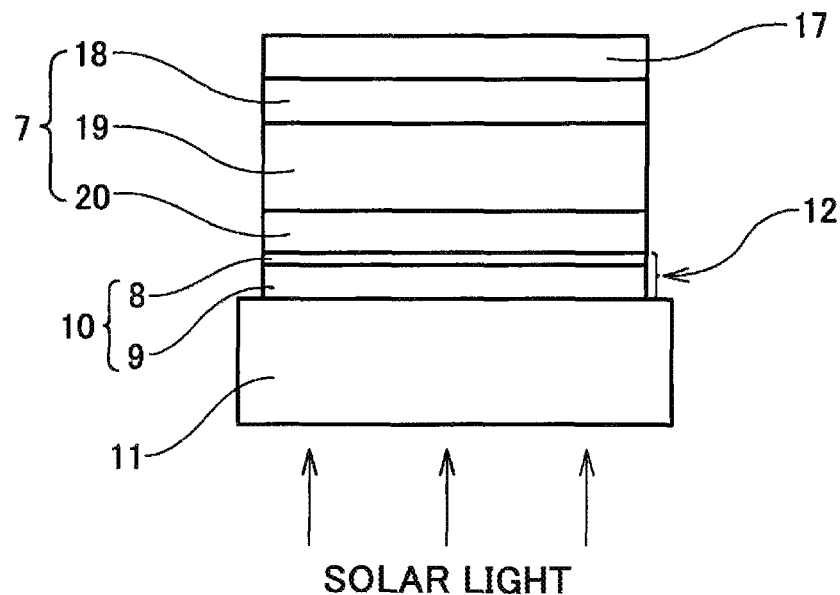
FIG. 5 is a schematic diagram illustrating another example of construction of a thin-film solar cell in which the layered transparent conductive oxide film of the present invention is used.
Figure 6:
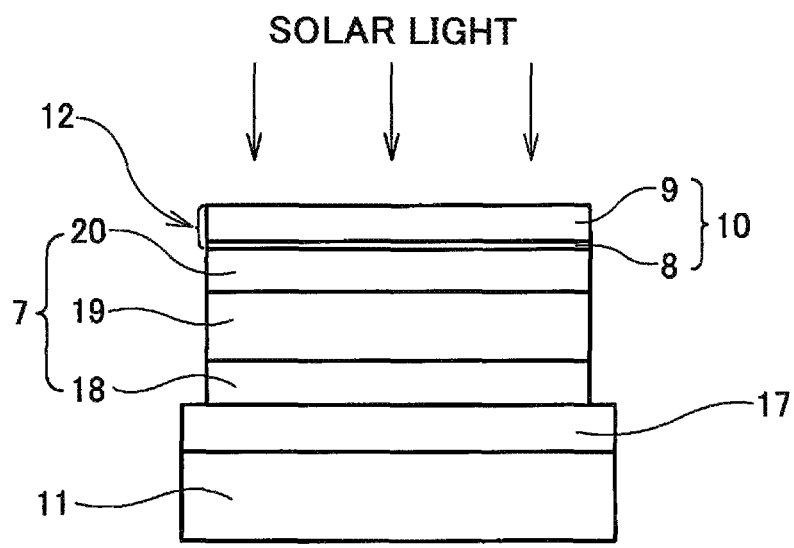
FIG. 6 is a schematic diagram illustrating yet another example of construction of a thin-film solar cell in which the layered transparent conductive oxide film of the present invention is used.

Next, the photoelectric conversion element of the present invention will be explained in further detail centering on a solar cell as a representative example. FIG. 4 to FIG. 6 illustrate three examples of a thin-film solar cell according to embodiments of the present invention. The thin-film solar cell according to one embodiment of the present invention includes at least a photoelectric conversion layer 7 and a transparent electrode 12, and a feature of this thin-film solar cell is using the layered transparent conductive oxide film 10 as the transparent electrode 12.

In the present invention, the structure of the photoelectric conversion layer 7 of the solar cell is not particularly limited, and the present invention can be applied to a solar cell that uses a PN-junction type photoelectric conversion layer 7 in which a p-type semiconductor and an n-type semiconductor are layered, or a PIN-junction type photoelectric conversion layer 7 in which an insulating layer (I layer) is arranged between a p-type semiconductor and an n-type semiconductor.

FIG. 4 illustrates an example of applying the present invention to a PIN-junction type amorphous silicon thin-film solar cell. As illustrated in FIG. 4, the layered film 10 of the present invention is used as a transparent electrode 12 on the incident light side of the photoelectric conversion layer 7. When incident light of the photoelectric conversion layer 7 is on both surfaces, a photoelectric conversion element that includes a double-sided light-receiving type photoelectric conversion layer 7 is applied, and a transparent electrode 12 is necessary on both surfaces of the photoelectric conversion layer 7. In this case, the layered film 10 of the present invention is formed as a transparent electrode 12 on both surfaces of the photoelectric conversion layer 7 as a substrate. In any case, forming a first transparent conductive oxide film 8 of the layered film 10 on the photoelectric conversion layer 7 side is a feature of the present invention.

Moreover, there is also a photoelectric conversion element that has structure that is similar to the structure illustrated in FIG. 3, one of the transparent electrodes 12 in FIG. 3 is not used as a front surface electrode, and a metallic reflective film which is to be used as a rear surface electrode is layered on top of this one transparent electrode 12, and the structure is a layered structure starting from the incident side of solar light of a transparent electrode 12, a photoelectric conversion layer 7, a transparent electrode 12 and a metallic reflective film such as Ag film or Al film. The present invention can be applied to a photoelectric conversion element having this kind of structure as well by forming layered film 10 as a transparent electrode 12 on both surfaces of a photoelectric conversion layer 7 as a substrate, and forming a first transparent conductive oxide film 8 of the layered film 10 on the photoelectric conversion layer 7 side. Using the layered film 10 of the present invention as a front surface electrode through which light enters from the outside is particularly effective, however, even when used as a rear surface electrode through which light does not enter from the outside, incident light is reflected multiple times inside the photoelectric conversion element, so using the layered film 10 of the present invention having less absorption in the near-infrared ray region is effective for improving the photoelectric conversion effect.

Solar cells are roughly classified according to the type of semiconductor material of the photoelectric conversion layer 7, and are classified as solar cells that use a silicon type semiconductor such as single-crystal silicon, polycrystal silicon, amorphous silicon and the like for the photoelectric conversion layer, as compound thin-film solar cells that use a compound semiconductor thin film that is represented by a CuInSe series, a Cu (In, Ga) Se series, an Ag (In, Ga) Se series, a CuInS series, a Cu (In, Ga) S series, an Ag (In, Ga) S series or a solid solution of these, a GaAs series, a CdTe series and the like as the photoelectric conversion layer, and as dye-sensitized solar cells (also called Gratzel-cell type solar cells) that use organic dye, however, the present invention can be applied to any solar cell, and by using the layered film 10 of the present invention as a transparent electrode 12, it is possible to achieve a high-efficiency solar cell.

Particularly, in a solar cell that uses amorphous silicon, or a compound thin-film solar cell, it is essential that a transparent electrode 12 that is transparent conductive film be provided as an electrode on the light-receiving unit side or front side that is the side where solar light enters, and by using the layered film 10 of the present invention as a transparent electrode 12, high conversion efficiency is achieved.

More specifically, an example of a thin-film solar cell that uses a silicon type semiconductor as a photoelectric conversion layer 7 will be outlined. A single-crystal or polycrystalline silicon substrate having a thickness, for example, of about 0.2 mm to 0.5 mm, and size of about 180 mm square is used as a PN-junction type photoelectric conversion layer, and inside this silicon substrate, a PN junction is formed in which a P layer that includes many P-type impurities such as boron or the like, and an N layer that includes many N-type impurities such as phosphorus or the like come in contact.

As a substrate for forming the layered film 10 of the present invention, in addition to the silicon substrate by which the photoelectric conversion layer 7 is constructed, it is possible to apply a transparent substrate 11 such as a glass plate, a resin plate, a resin film or the like. In this case, after the layered film 10 of the present invention is formed as a transparent electrode 12, by layering a photoelectric conversion layer 7 that is made using amorphous or polycrystalline silicon on top of the transparent electrode 12, it is possible to form a thin-film silicon type solar cell.

On the other hand, in a solar cell that uses amorphous silicon, a PIN-junction type photoelectric conversion layer in which an insulating layer (I layer) is arranged between a PN junction is used. In other words, as illustrated in FIG. 4, an amorphous silicon solar cell includes a structure in which a front surface transparent electrode 12 placed on the light-receiving side, a P layer 13 that is made using a p-type amorphous silicon film or a hydrogenated amorphous silicon carbide film, an I layer 14 that is made using an amorphous silicon film that does not include impurities, an N layer 15 that is made using a n-type amorphous silicon film, a rear-side transparent electrode film 16 that functions as a contact improving layer, and rear-surface electrode 17, are layered on a glass substrate 11. Here, the p-type amorphous silicon film or hydrogenated amorphous silicon carbide film 13, amorphous silicon film 14 that does not include impurities, and the n-type amorphous silicon film 15 are formed by a plasma CVD method. Germanium, carbon, nitrogen, tin and the like may be included in the amorphous silicon film or hydrogenated amorphous silicon carbide film in order to control a light absorption wavelength thereof.

In this amorphous silicon solar cell, the layered film 10 of the present invention is used as the front surface transparent electrode 12 placed on the light-receiving side. In this case, the first transparent conductive oxide film 8 must be formed on the photoelectric conversion layer 7 side that includes the silicon films 13 to 15.

Thin-film solar cells that use a silicon thin film are classified as thin-film solar cells in which the photoelectric conversion layer that includes silicon thin film, or in other words, a PIN-junction layer, is formed using an amorphous silicon type thin film, as thin-film solar cells in which PIN-junction layer is formed using a microcrystalline silicon type thin film, and as thin-film solar cells in which the PIN-junction layer is formed using a tandem thin-film photoelectric conversion layer in which a photoelectric conversion layer that is formed using an amorphous silicon type thin film, and a photoelectric conversion layer that is formed using a microcrystalline silicon type thin film are layered. There are also solar cells in which the number of photoelectric conversion layers is three layers or more.

These solar cells are not limited by the structure thereof, and as long as the layered film 10 of the present invention is used as a transparent electrode 12, all are encompassed by the present invention. In addition, solar cells that include a hybrid-type photoelectric conversion layer in which a single-crystal silicon substrate or polycrystalline silicon substrate, and the amorphous silicon type thin film and/or microcrystalline silicon type thin film above are layered are also encompassed by the present invention as long as the layered film of the present invention is used as a transparent electrode.

Next, a compound thin-film solar cell to which the present invention is applied will be explained. This compound thin-film solar cell is normally formed using a heterojunction of an n-type semiconductor intermediate layer that is made using a compound semiconductor that has a wide band gap, and a p-type semiconductor light absorbing layer that is made using a compound semiconductor having a narrow band gap. The typical structure of this solar cell includes a front-surface electrode made using transparent conductive film, a window layer, an intermediate layer, a light-absorbing layer, and a rear-surface electrode made using a metallic or transparent conductive film.

More specifically, as illustrated in FIG. 5, this compound thin-film solar cell includes a structure in which a transparent electrode 12 that comprises the layered film 10 of the present invention, a window layer 20, a semiconductor intermediate layer 19, a p-type semiconductor light-absorbing layer 18 and a rear-surface electrode 17 are layered on a glass substrate 11. Moreover, FIG. 6 illustrates a compound thin-film solar cell having different structure in which a bottom-section electrode or in other words a rear-surface electrode 17, a p-type semiconductor light-absorbing layer 18, a semiconductor intermediate layer 19, a window layer 20, and a transparent electrode 12 that comprises the layered film 10 of the present invention are layered on a glass substrate 11.

In either structure, the transparent electrode 12 side is the incident side of the solar light. Moreover, in either structure, in the layered film 10 of the present invention that is used for the transparent electrode 12, the first transparent conductive oxide film 8 must be formed on the photoelectric conversion layer 7 side.

The substrate on which a photoelectric conversion element of a solar cell, including a compound thin-film solar cell, or the like is formed is not limited to being a transparent substrate 11 such as a glass plate or the like, and as the material thereof, it is possible to use various kinds of glass, resin, metal, ceramic and the like. Moreover, using a transparent substrate as the substrate is preferred, however, depending on the use, it is also possible to use a non-transparent substrate. When a resin substrate is used, the structure thereof is arbitrary, and it is possible to apply various structures such as a plate shape, film and the like. Furthermore, the material of the resin is also arbitrary, and for example, it is possible to use a resin having a low melting point of 150° C. or less. For a metal substrate, it is possible to use stainless steel, aluminum and the like, and for a ceramic substrate, it is possible to use alumina, zinc oxide, carbon, silicon nitride, silicon carbide and the like. Moreover, a ceramic substrate may also include one or more oxide that is selected from among Ga, Y, In, La, Si, Ti, Ge, Zr, Sn, Nb, and Ta as an oxide other than alumina and zinc oxide. For example, it is possible to use $Ga_2O_3$, $Y_2O_3$, $In_2O_3$, $La_2O_3$, $SiO_2$, $TiO_2$, $GeO_2$, $ZrO_2$, $SnO_2$, $Nb_2O_5$, $Ta_2O_5$ and the like.

In the present invention, these substrates that include glass, resin, and ceramic are called non-metallic substrates. Preferably, at least one surface of the substrate are made so as to easily reflect incident solar light by providing mountain-shaped unevenness, or forming roughness by etching or the like.

As the rear-surface electrode 17, a conductive electrode material that includes Mo, Ag, Au, Ti, Pd, Ni, alloys of these and the like are used, and preferably Mo, Ag, Au or Al is used. The thickness of the rear-surface electrode 17 is normally within the range 0.5 µm to 5 µm, and preferably within the range 1 µm to 3 µm. The formation procedure is not particularly limited, however, it is possible to use, for example, a direct-current magnetron sputtering method, a vacuum deposition method, a CVD method and the like.

As the p-type semiconductor constituting the light-absorbing layer 18, it is possible to use $CuInSe_2$, $CuInS_2$, $CuGaSe_2$, $CuGaS_2$, $AgInSe_2$, $AgInS_2$, $AgGaSe_2$, $AgGaS_2$ and solid solutions of these, or CdTe. Conditions that are required in order to obtain a high energy conversion efficiency is an optimum optical design in order to obtain more photocurrent, and making high-quality heterojunctions and thin film with no carrier recombination at the boundary of the thin film and particularly in the absorption layer. The thickness of the light-absorbing layer 18 is normally within the range 1 µm to 5 µm, and preferably within the range 2 µm to 3 µm. The formation procedure is not particularly limited, however, it is possible to use, for example, a vacuum deposition method, a CVD method and the like. A high-quality heterojunction is closely related to the intermediate layer/light-absorbing layer combination, and useful heterojunctions are obtained in CdS/CdTe type, CdS/$CuInSe_2$ type, CdS/Cu (In, Ga) $Se_2$ type, CdS/Ag (In, Ga) $Se_2$ type combinations and the like.

In order to increase the battery efficiency, a semiconductor such as CdS, CdZnS and the like that has a wider band gap is used as the semiconductor thin film constituting the intermediate layer 19. With these semiconductor thin films, it is possible to improve the sensitivity of the short wavelength range in solar light. The thickness of the intermediate layer 19 is normally within the range 10 nm to 200 nm, and preferably within the range 30 nm to 100 nm. The formation procedure for the intermediate layer 19 is not particularly limited, however, in the case of a CdS thin film, a solution precipitation method in which a mixed solution of $CdI_2$, $NH_4Cl$, $NH_3$ and thiourea is used. Furthermore, on the incident light side of the CdS or (Cd, Zn) S as the intermediate layer 19, it is possible to arrange a semiconductor having a larger band gap than these thin films as a window layer 20. As a result, a high-performance solar cell having high reproducibility is achieved. The window layer 20, for example, is configured of thin film such as ZnO or (Zn, Mg) O thin film or the like, the conductivity thereof being about the same as that of CdS thin film, and normally the thickness is about 50 nm to 300 nm, and preferably about 100 nm to 200 nm. Moreover, the formation procedure for the window layer 20 is not particularly limited, however, may be formed by a direct-current magnetron sputtering method that uses a ZnO or the like for the target, and uses argon as the sputtering gas.

In a compound thin-film solar cell that is one kind of solar cell as a photoelectric conversion element to which the present invention is particularly applied, the layered film 10 of the present invention is applied as a transparent electrode 12 on the front surface or on both the front surface and rear surface that are the incident sides where solar light enters. The layered film 10 of the present invention not only has lower resistance and a higher transmittance in the infrared ray region than a conventional transparent conductive film, but is possible to obtain high conversion efficiency because the good conductivity of the layered film on the side that comes in contact with the semiconductor layer.

In either kind of solar cell described above, a bus bar electrode and finger electrode are respectively formed by a screen printing method that uses silver paste on the front-surface side or both the front-surface side and rear-surface side that are the light-receiving surfaces, and these electrode surfaces are solder coated over mostly the entire surfaces in order to protect the surfaces and so that connection tabs can be easily attached. When the photoelectric conversion layer of a photoelectric conversion element such as a solar cell is configured using a silicon substrate, a transparent protective material such as a glass plate, a resin plate, a resin film or the like is provided on the light-receiving surface sides.

(3) Method for Manufacturing a Photoelectric Conversion Element

Next, a method for manufacturing the photoelectric conversion element of the present invention will be explained in detail centering on the method for manufacturing a solar cell as a representative example. A feature of the method for manufacturing a solar cell that includes at least the photoelectric conversion layer and transparent electrode of the present invention is the point of forming the layered transparent conductive oxide film of the present invention as the transparent electrode by the following processes using an inline-type sputtering method.

(3-1) Forming Layered Film 10 on the Photoelectric Conversion Layer 7

Figure 7:
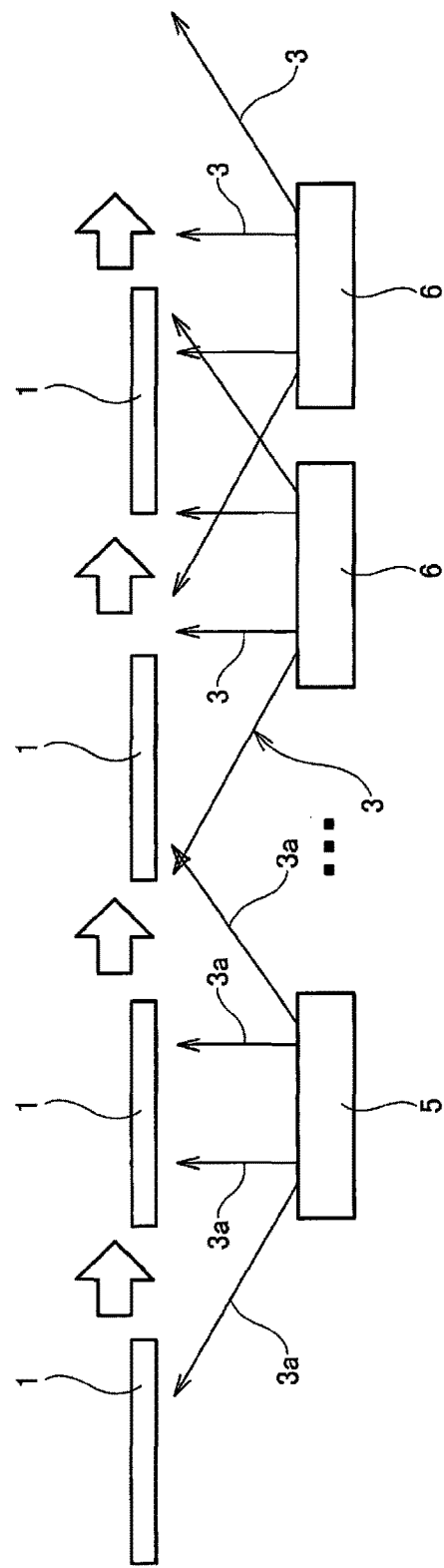
FIG. 7 is a schematic diagram illustrating the process for forming a layered transparent conductive oxide film on the surface of a photoelectric conversion layer using an inline-type sputtering method according to an embodiment of the present invention.

FIG. 7 illustrates a first embodiment of a method for manufacturing a photoelectric conversion element of a solar cell that includes at least the photoelectric conversion layer 7 (refer to FIG. 2) and the layered film 10 of the present invention. In this first embodiment, the layered film 10 (refer to FIG. 2) that will be the transparent electrode 12 is formed on the photoelectric conversion layer 7 using an inline-type sputtering method. When doing this, the photoelectric conversion layer 7 is conveyed as a substrate 1, and a first transparent conductive oxide film 8 and second transparent conductive oxide film 9 are layered in that order on the front surface of the substrate 1 being conveyed.

More specifically, when forming the transparent electrode 12 on the surface of the substrate 1 while conveying the substrate 1 corresponding to the photoelectric conversion layer 7 in a specified direction, without using an ITiO sintered body, the first transparent conductive oxide film 8 is formed using at least an ITO sintered body or IO sintered body that includes elements that oxidize more difficulty than ITiO as a target 5 that passes first. Depending on the film thickness of the first transparent conductive oxide film 8, it is possible to arrange two or more targets 5 that use the ITO sintered body or IO sintered body.

A second transparent conductive oxide film 9 is further formed using an ITiO sintered body on top of the first transparent conductive film 8 that is formed on the substrate 1 being conveyed as a target 6 that passes after. Normally, depending on the film thickness of the second transparent conductive oxide film 9, two or more targets 6 that use an ITiO sintered body are arranged.

(3-2) Forming Layered Film 10 on a Transparent Substrate 11

Figure 8:
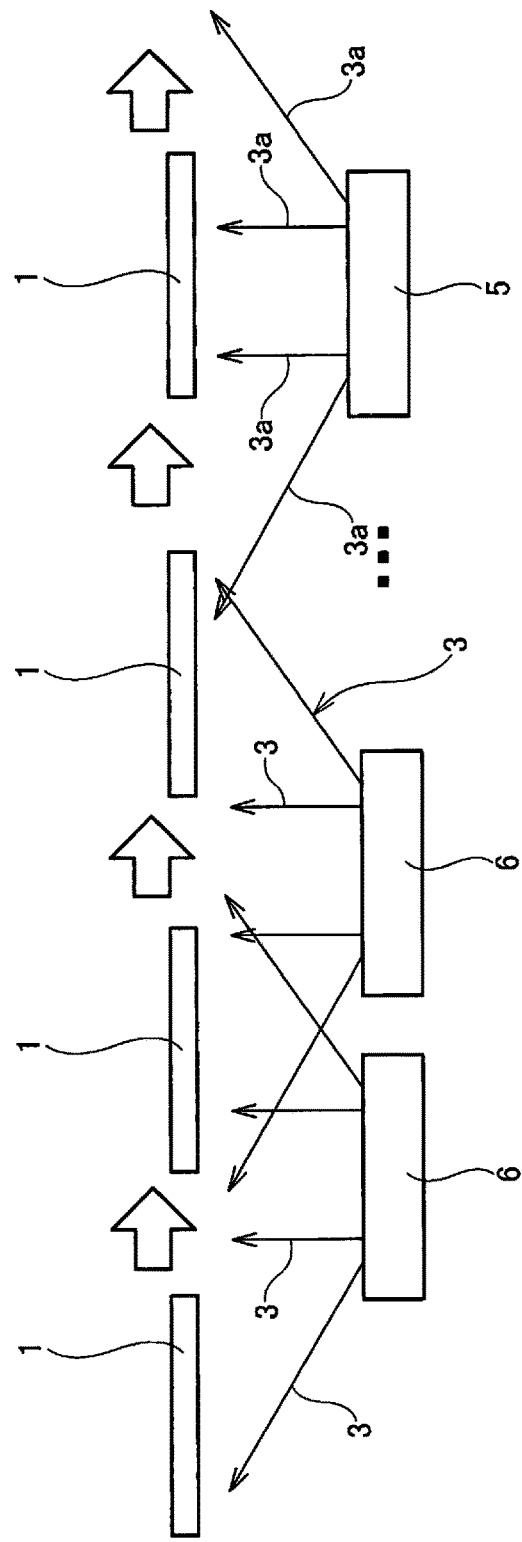
FIG. 8 is a schematic diagram illustrating the process for forming a layered transparent conductive oxide film on the surface of a photoelectric conversion layer using an inline-type sputtering method according to another embodiment of the present invention.

FIG. 8 illustrates a second embodiment of a method for manufacturing a photoelectric conversion element of a solar cell that includes at least the photoelectric conversion layer 7 (refer to FIG. 4) and the transparent electrode 12 of the present invention. In this second embodiment, a transparent substrate 11 is conveyed as the target 1 instead of the photoelectric conversion layer 7, and a layered film 10 (refer to FIG. 4) corresponding to a transparent electrode 12 is formed on top of the substrate 1 being conveyed using an inline-type sputtering method. When doing this, a second transparent conductive oxide film 9 and a first transparent conductive oxide film 8 are formed in that order on the front surface of the transparent substrate 11.

More specifically, when forming a transparent electrode 12 on the substrate 1 while conveying the substrate 1 that is the transparent substrate 11 in a specified direction, first the substrate 1 is passed over plural targets 6 that use an ITiO sintered body for forming the second transparent conductive oxide film 9 that mainly forms the transparent electrode 12, and the second transparent conductive oxide film 9 having a specified thickness is formed on the substrate 1. Then, a first transparent conductive oxide film 8 having a specified film thickness is formed at least on the target 5 that the substrate 1 passes over last using an ITO sintered body or IO sintered body without using an ITiO sintered body.

After the layered film 10 is formed on the substrate 1 in this way, a photoelectric conversion layer 7 (refer to FIG. 4) is formed on top of the upwardly exposed first transparent conductive oxide film 8 of the layered film 10.

As a result, the first transparent conductive oxide film 8 that includes ITO film or IO film is formed on the photoelectric conversion layer 7 side, and it is possible to make a transparent electrode 12 that includes the layered film 10 of the present invention.

By following these manufacturing methods, a first transparent conductive oxide film 8 that includes an ITO film or IO film is formed on the top surface of the photoelectric conversion layer 7 of a photoelectric conversion element of a solar cell, so it is possible for an electric charge that is generated in the photoelectric conversion layer 7 to efficiently flow to the transparent electrode 12 without having to form a high-resistance film on the top surface of the photoelectric conversion layer 7 due to oxidization of titanium. Moreover, by thinly forming ITO film or IO film having good conductivity as the first transparent conductive oxide film 8 on the top layer of the photoelectric conversion layer 7, and thickly forming the second transparent conductive oxide film 9 that includes ITiO film having high transparency in the near-infrared ray region and good conductivity, it is possible for much incident light in the near-infrared ray region to enter into the photoelectric conversion layer 7.

The film formation conditions when forming the first transparent conductive oxide film and second transparent conductive oxide film of the layered transparent conductive oxide film of the present invention by various film formation methods including an inline-type sputtering method are arbitrary according to the target, size of the substrate on which film is formed, and the like, and are appropriately set according to the characteristics required for the transparent electrode of the photoelectric conversion element. Therefore, an explanation here is omitted, however, it is possible to refer to the embodiments that will be described later.

Moreover, the explanation of the film formation method, including the film formation conditions described in the literature cited in this specification are incorporated in this specification by reference.

The layered film 10 according to the present invention that has a layered structure in which the first transparent conductive oxide film 8 that includes ITO film or IO film and the second transparent conductive oxide film 9 that includes ITiO film are layered is useful as a transparent electrode of various kinds of photoelectric conversion elements in addition to use in solar cells, light-detecting elements, touch panels, flat panel display elements such as LCD elements, PDP elements, EL elements and the like, and light-emitting devices such as LEDs, LDs and the like.

For example, in the case of light-detecting elements, the structure is included in which a glass electrode, transparent electrode on the incident light side, light-detecting-material layer for detecting infrared light and the like, and a rear-surface electrode are layered. As the light-detecting-material layer for detecting infrared light, there is a type that uses a semiconductor material with Ge or InGeAs as a base material, for example, a photodiode (PD), or an avalanche photodiode (APD) and the like, and there is a type that uses a material obtained by adding one or more type of element selected from Eu, Ce, Mn, and Cu, and one or more element selected from among Sm, Bi and Pb that are added to a sulfide or selenide of an alkaline earth metal element. In addition to this, APD that uses a laminate of an amorphous silicon germanium and amorphous silicon is also known. A layered transparent conductive oxide film according the present invention that has a layered structure in which a first transparent conductive oxide film and a second transparent conductive oxide film are layered can be applied to the transparent electrode on the incident light side that comes in contact with the light-detecting-material layer of this light-detecting element.

EXAMPLES

First, demonstrated examples that use a photoelectric conversion element and solar cell are used as reference examples of characteristics of a photoelectric conversion element for the case in which ITiO film or ITO film are formed separately as a premise for completing the layered transparent conductive oxide film of the present invention are described. After that, examples and comparative examples will be described on the premise of the reference examples.

Reference Examples 1 to 16

"Manufacture and Evaluation of ITiO Film by Stationary Facing Target Film Formation"

For the purpose of comparison with the present invention, ITiO film was made as a transparent conductive oxide film of a transparent electrode by a stationary facing target film formation method using an inline-type sputtering apparatus and in which a glass substrate was placed directly above the ITiO target, and the glass substrate was not conveyed.

Figure 9:
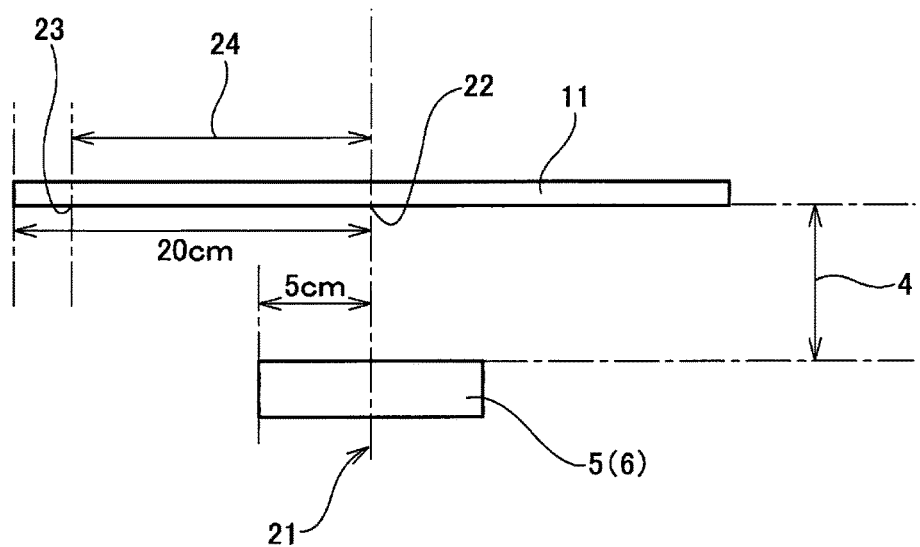
FIG. 9 is a schematic diagram of a reference example, and illustrates the arrangement of the apparatus when performing stationary facing target type film formation using an inline-type sputtering method.

In Reference Example 1, as illustrated in FIG. 9, first, an ITiO sintered body target 6 (manufactured by Sumitomo Metal Mining Co., Ltd.) having a sputtering surface size of 10 cm×150 cm was placed on the direct-current magnetron cathode of an inline-type sputtering apparatus. As the sputtering conditions, the inside of the vacuum chamber of the sputtering apparatus was evacuated beforehand to a pressure of $2\times10^{-4}$ Pa or less, after which 99.99% pure argon gas mixed with 0.2 vol % to 10 vol % oxygen gas was introduced until the reaching a specified gas pressure within the range 0.2 Pa to 0.8 Pa, and then 500 W direct-current electric power was applied to the target 6.

Pre-sputtering was performed for 10 minutes in a state in which there was no substrate placed directly above the target 6, then after performing cleaning of the surface of the target 6, the electric power was turned OFF. After that, a 40 cm×40 cm×1.0 mm (t) glass substrate 11 that was heated to 100° C., was placed at a position 22 directly above the center 21 of the target 6, and made stationary. With the substrate 11 as is in a stationary state of not being conveyed, 500 W direct-current electric power was applied again to the target 6 and film formation was performed for a specified amount of time, and an ITiO transparent conductive film was formed on the surface of the glass substrate 11. After film formation, heat treatment of the glass substrate 11 was performed in a vacuum chamber for 30 minutes at 180° C., then the glass substrate 11 was cooled inside the vacuum until the substrate temperature reached 80° C. or less, after which the glass substrate 11 on which an ITiO film was formed was taken out into the atmosphere.

Conductivity of an ITiO transparent conductive film depends on the amount of oxygen gas that is mixed with the argon gas during film formation, however, in Reference Example 1, an amount of oxygen gas for which conductivity of the film at a position 22 directly above the center 21 of a target 6 where the amount of adhered film is the greatest was adopted. Then, the film formation time was set so that the film thickness at a position 22 directly above the center 21 of the target 6 became 100 nm.

The ITiO film of Reference Example 1 was manufactured in this way. First, before film formation, a small mark was made beforehand using oil-based magic ink at a measurement position on the substrate, the film adhering to the mark surface was removed to expose the surface of the substrate, the distance between the film surface and the substrate surface was measured using a contact type surface shape measuring instrument (Alpha-Step IQ, manufactured by KLA-Tencor Corporation), and that distance was taken to be the film thickness, then the film formation speed of the ITiO film that was obtained was calculated from this film thickness. Then, based on this film formation speed, film formation was performed for a specified amount of time so that the film thickness at a position 22 directly above the center 21 of the target 6 became 100 nm, and the film thickness was measured and checked using the same method. For Reference Examples 2 to 16 as well, after calculating the film formation speed, film formation was performed to the same film thickness.

Next, the specific resistance of the obtained film was measured by measuring the surface resistance values at position 22 on the substrate surface directly above (0 cm) the center 21 of the target 6 and at a position 23 that is separated 15 cm from directly above (0 cm) the center 21 of the target 6 using a resistance measuring instrument (Loresta-EPMCP-T360, manufactured by DIA Instruments Inc.) using a four-end needle method, and the specific resistances were calculated from the film thickness of the film at these respective positions. As a result, it was found that the specific resistances of the ITiO film of Reference Example 1 were 220 Ω·cm (position at 0 cm), and 340 Ω·cm (position at 15 cm).

The composition of the obtained ITiO film, in other words, the amount of titanium included as an added element in terms of atomic ratio with respect to the total amount of titanium and indium was measured using an ICP mass spectrometer (Agilent 7500 cs, manufactured by Yokogawa Analytical Systems Co., Ltd.). As a result, the composition of the ITiO film was the same as the composition of the target.

As Reference Examples 2 to 16, except for changing the composition of the ITiO target, the sputtering gas pressure (total pressure), and the distance between the target and substrate, film formation of the ITiO film was performed under the same conditions as for Reference Example 1, the specific resistance of the ITiO film that was formed on the glass substrate was measured in the same way as for Reference Example 1, and the relationship between the specific resistance and the distance from directly above the center of the target was examined.

The composition, film formation conditions (sputtering gas pressure (total pressure), distance between target and substrate), and the specific resistances of the obtained ITiO film at a position (0 cm) directly above the center of the target, and a position separated 15 cm from directly above the center of the target of each of the respective targets of Reference Examples 1 to 16 are given in Table 1. The composition of the ITiO films and the composition of the targets in Reference Examples 2 to 16 were also the same.

For the ITiO film of Reference Examples 1 to 16, the parallel light transmittance and the parallel light reflectance of the film were further measured using a spectrophotometer (U-4000, manufactured by Hitachi Ltd). Then, using a Hall effect measurement device (manufactured by Toyo Corporation), the specific resistances of the film, the carrier electron concentration, and the carrier electron mobility were found by a Hall effect measurement method that uses the Van der Pauw method (refer to "Physics Engineering Experiment 2 Semiconductor Technology", Katsufusa Shono, Tokyo University Press; pg. 105). The specific resistances of the ITiO films of Reference Examples 1 to 16 are also given in Table 1.

In regard to the parallel light transmittance and parallel light reflectance of the film, it was confirmed from the results obtained from spectrophotometer measurement and Hall effect measurement that in the ITiO films obtained in Reference Examples 1 to 16 (see Table 1), at the position directly above (0 cm) the center of the target, the average transmittance of the film itself at wavelengths from 800 nm to 1200 nm was 72% or greater, and not only was the transmittance high in the visible light region but was also high in the near-infrared ray region, and the carrier electron mobility was also a high 65 m$^2$/(V·sec) to 85 cm$^2$/(V·sec).

Moreover, X-ray diffraction measurement (manufactured by PANalytical) of the film was performed, and the crystallinity and crystal phase of the film was examined. From X-ray diffraction measurement of the ITiO films, it was confirmed that each of the films included an indium oxide phase having a bixbyite-type crystal structure and had excellent crystallinity.

In regard to specific resistance, the specific resistance of the films at a position (0 cm) directly above the center of the target for each Reference Example 1 to 16 was good and was within the range 220 μΩ·cm to 310 μΩ·cm.

However, for Reference Examples 1 to 4, 8, 9, 11, 12, 14 and 15 in Table 1, the sputtering gas pressure was low, and the distance between the target and the substrate was short, so at a position separated 15 cm from directly above (0 cm) the center of the target, the specific resistance of the film was 6×10$^{-4}$ Ω·cm or less, and when compared with the position direction above the center of the target, increased about 1×10$^{-4}$ Ω·cm.

Moreover, for Reference Examples 5 to 7, 10, 13 and 16 in Table 1, the sputtering gas pressure was high, or the distance between the target and the substrate was long, so the specific resistance at a position separated 15 cm from directly above (0 cm) the center of the target was remarkably high when compared with the specific resistance of the film directly above (0 cm) the center of the target. It was learned from the Hall effect measurement results that this increase in specific resistance was due to a remarkable decrease in both the carrier electron concentration and carrier electron mobility. This remarkable decrease in the carrier electron concentration and carrier electron mobility is presumed to be due to an excessive incorporation of oxygen into the film.

The tendency became more noticeable the further the film was separated from being directly above the center of the target, and became more noticeable the larger the amount of titanium included was. Moreover, this same tendency was also exhibited when separated in the conveyance direction of the substrate from being directly above the center of the target.

Therefore, when film is formed while conveying the substrate under the condition of a high sputtering gas pressure, or a long distance between the target and the substrate, it is understood that ITiO film having insufficient conductivity will first begin to be formed on the surface of the substrate at a position separated from target.

TABLE 1

| Target Composition | Film Formation Condition | | Specific Resistance of Film ($\mu\Omega \cdot cm$) | |
| --- | --- | --- | --- | --- |
| Ti content at the atomic ratio Ti/(In + Ti) (atomic %) | Total pressure (Pa) | Distance between target and substrate (mm) | 0 cm position | 15 cm position |
| RE 1 | 1.725 | 0.2 | 50 | 220 | 340 |
| RE 2 | | 0.4 | 40 | 240 | 360 |
| RE 3 | | 0.8 | 50 | 230 | 370 |
| RE 4 | | 0.6 | 70 | 250 | 450 |
| RE 5 | | 0.4 | 120 | 280 | 1230 |
| RE 6 | | 0.8 | 70 | 255 | 950 |
| RE 7 | | 0.8 | 110 | 280 | 1040 |
| RE 8 | 0.500 | 0.4 | 60 | 350 | 410 |
| RE 9 | | 0.6 | 70 | 310 | 490 |
| RE 10 | | 0.8 | 110 | 320 | 1010 |
| RE 11 | 2.600 | 0.4 | 50 | 210 | 310 |
| RE 12 | | 0.6 | 70 | 220 | 510 |
| RE 13 | | 0.8 | 110 | 270 | 2400 |
| RE 14 | 3.500 | 0.4 | 50 | 270 | 320 |
| RE 15 | | 0.6 | 70 | 290 | 560 |
| RE 16 | | 0.8 | 110 | 310 | 2900 |

*RE: Reference Example

Reference Example 17

"Manufacture and Evaluation of ITiO Film by Stationary Facing Target Film Formation (Without Substrate Heating)"

Except for absolutely not performing heating substrate during film formation, transparent conductive films were manufactured and evaluated under all of the same conditions and by the same method as in Reference Examples 1 to 16 in Table 1.

Even when heating substrate during film formation was not performed at all, for the ITiO film that was formed at a position directly above (0 cm) the center of the target, even though it was confirmed that the carrier electron concentration was $0.5 \times 10^{21}$ cm$^{-3}$ or less, it was confirmed that the ITiO film exhibited excellent conductivity due to a high carrier electron mobility of 68 cm$^2$/(V·sec) to 92 cm$^2$/(V·sec), and high transparency in the near-infrared ray range with transmittance of the film itself at a wavelength of 800 to 1200 nm being 72% or greater.

However, as in the case of Reference Example 1 to 16, when the sputtering gas pressure was low and the distance between the target and the substrate was short, the specific resistance at a position separated 15 cm from directly above (0 cm) the center of target was a little high compared with film directly above the center of the target, however the increase ratio was low, and the conductivity was in a high state. However, when the sputtering gas pressure was high or the distance between the target and the substrate was long, when one of these conditions was satisfied, the specific resistance at a position separated 15 cm from directly above the center of the target became extremely high compared with the specific resistance of film at a position directly above the center of the target, and this tendency became more remarkable the more the film separates from directly above the center of the target, or the larger the amount of titanium became. Moreover, the same tendency was exhibited even in the case of film being separated in the conveyance direction of the substrate from directly above the center of the target. It was similarly confirmed by Hall effect measurement that the increase in the specific resistance of film that was separated 15 cm from directly above the center of the target was due to a remarkable decrease in the carrier electron concentration and carrier electron mobility.

Reference Example 18

"Manufacture and Evaluation of ITiO Film by Stationary Facing Target Film Formation (Using a Rotary Cathode)"

Except for using a cylindrical shaped rotary cathode comprising a sintered body having the same composition as in Reference Examples 1 to 16, ITiO film was manufactured and evaluated under the same conditions.

For any ITiO film in Reference Example 18 as well, it was confirmed that ITiO film that was formed at a position directly above (0 cm) the center of the target exhibited excellent conductivity, and excellent transparency in the near-infrared ray region. However, even in Reference Example 18, the relationship between the characteristics of the ITiO film and the distance between the target and the substrate was the same as in Reference Examples 1 to 16.

Reference Examples 19 to 37

"Manufacture and Evaluation of ITiO Film by Stationary Facing Target Film Formation (with Substrate Heating)"

Except for changing the target from an ITiO sintered body to a ITO sintered body (Reference Examples 19 to 25, 29 to 37), or to an IO sintered body (Reference Examples (26 to 28), films were manufactured and evaluated in the same way as in Reference Examples 1 to 16, including the method for setting the amount of oxygen mixed in during film formation.

The target composition, the film formation conditions and the evaluation results for the obtained films are given in Table 2. The compositions of the obtained films were mostly the same as the target compositions, and as a result of performing X-ray diffraction measurement (equipment manufactured by PANalytical) of the film, it was confirmed that all of the films had excellent crystallinity.

As illustrated in Table 2, when an IO sintered body, or an ITO sintered body of which the amount of Sn included at an atomic ratio of Sn/(In+Sn) is 19 atomic % or less was used as the target, the specific resistance of the film at a position separated 15 cm from directly above (0 cm) the target was a little high compared with the specific resistance of film at a position directly above the center of the target, however the increase ratio was small and was $6 \times 10^{-4}$ Ω·cm or less. From Hall effect measurement of film having a film thickness of 100 nm at a position directly above the center of the target, it was found that even though the carrier electron mobility was a low 25 cm$^2$/(V·sec) to 45 cm$^2$/(V·sec), the carrier electron concentration was high at about $0.9 \times 10^{21}$ cm$^{-3}$ to $1.8 \times 10^{21}$ cm$^{-3}$, so the film had high conductivity. This tendency was the same for the film at a position 15 cm separated from directly above the center of the target. Moreover, this tendency was maintained even when one of the conditions of the sputtering gas pressure being high or the distance between the target and substrate being long was satisfied.

Therefore, it is understood that when ITO film or IO film was formed using an ITO sintered body or an IO sintered body as a target, film having good conductivity was formed on the top surface of the substrate even when under conditions of a high sputtering gas pressure or a long distance between the target and substrate, film was formed while conveying the substrate and even at a position separated from the target.

TABLE 2

| Target | Film Formation Condition | | Specific Resistance of Film ($\mu\Omega \cdot$ cm) | |
|---|---|---|---|---|
| Composition Sn content at the atomic ratio Sn/(In + Sn) (atomic %) | Total pressure (Pa) | Distance between target and substrate (mm) | 0 cm position | 15 cm position |
| RE 19  9.284 | 0.2 | 50 | 130 | 190 |
| RE 20 | 0.4 | 40 | 140 | 210 |
| RE 21 | 0.8 | 50 | 140 | 200 |
| RE 22 | 0.6 | 70 | 160 | 210 |
| RE 23 | 0.4 | 120 | 180 | 220 |
| RE 24 | 0.8 | 70 | 155 | 210 |
| RE 25 | 0.8 | 110 | 190 | 220 |
| RE 26  0.000 (IO) | 0.4 | 60 | 440 | 500 |
| RE 27 | 0.6 | 70 | 445 | 510 |
| RE 28 | 0.8 | 110 | 460 | 530 |
| RE 29  12.070 | 0.4 | 50 | 290 | 340 |
| RE 30 | 0.6 | 70 | 260 | 350 |
| RE 31 | 0.8 | 110 | 310 | 385 |
| RE 32  18.568 | 0.4 | 50 | 390 | 430 |
| RE 33 | 0.6 | 70 | 410 | 450 |
| RE 34 | 0.8 | 110 | 425 | 490 |
| RE 35  2.785 | 0.4 | 60 | 310 | 385 |
| RE 36 | 0.6 | 70 | 335 | 395 |
| RE 37 | 0.8 | 110 | 350 | 400 |

*RE: Reference Example

Reference Example 38

"Manufacture of ITO Film by Stationary Facing Target Film Formation (Without Substrate Heating)"

Except for absolutely not performing heating substrate during film formation, transparent conductive film was manufactured under all of the same conditions and by the same method as in Reference Examples 19 to 37, and as a result, the same tendencies as those in Reference Examples 19 to 37 were exhibited.

In other words, when an IO sintered body or an ITO sintered body of which the amount of Sn included at an atomic ratio Sn/(In+Sn) of 19 atomic % or less was used as the target, the specific resistance of the film at a position separated 15 cm from directly above (0 cm) the center of the target was a little high compared with the specific resistance of film at a position directly above the center of the target, however, the increase ratio was small, and the conductivity was good. From Hall effect measurement of the film directly above the center of the target, it was found that the carrier electron mobility was low at about 25 cm$^2$/(V·sec) to 43 cm$^2$/(V·sec), however, the carrier electron concentration was high at about $0.8 \times 10^{21}$ cm$^{-3}$ to $1.9 \times 10^{21}$ cm$^{-3}$, so the film exhibited high conductivity at a specific resistance of about 120 μΩ·cm to 430 μΩ·cm. This tendency was the same for film at a position separated 15 cm from directly above the center of the target. Moreover, this tendency was maintained even under a condition of a high sputtering gas pressure or long distance between the target and the substrate.

Reference Example 39

"Manufacture and Evaluation of ITO Film by Stationary Facing Target Film Formation (Using a Rotary Cathode)"

Except for using a cylindrical shaped rotary cathode comprising a sintered body having the same composition as in Reference Examples 19 to 37, ITO film or IO film was manufactured and evaluated under all of the same conditions, and the same tendencies as in Reference Examples 19 to 37 were exhibited.

Example 1

Figure 10:
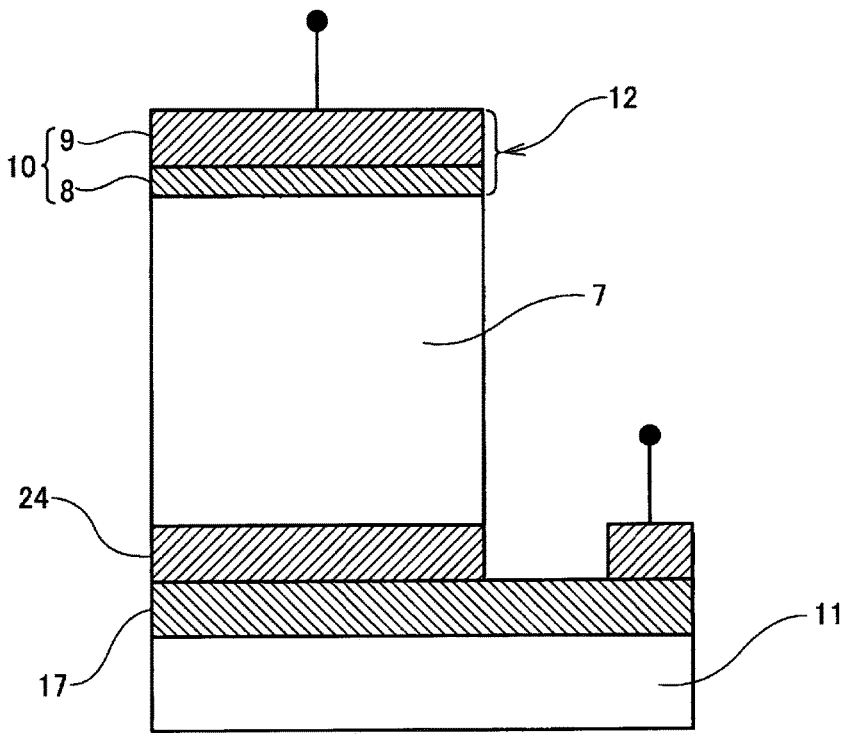
FIG. 10 is a schematic diagram illustrating an embodiment of construction of a thin-film solar cell in which the layered transparent conductive oxide film of the present invention is used.

In manufacturing the layered transparent conductive oxide film of Example 1, the ITO film of Reference Example 23 was used as the first transparent conductive oxide film, and the ITiO film of Reference Example 5 was used as the second transparent conductive oxide film. A thin-film solar cell having the structure illustrated in FIG. 10 was made using the obtained layered film 10 for the transparent electrode 12 of the solar cell.

First, a rear-surface metallic electrode 17 was formed on top of an insulating substrate 11 that includes 3.0 mm thick soda-lime glass (manufactured by Nihon Sheet Glass Co., Ltd.) by forming an approximately 200 nm thick silver layer by a sputtering method. Next, a 50 nm thick aluminum-containing zinc oxide (AZO) film as barrier layer 24 was formed on top of the rear-surface metallic electrode 17 by a sputtering method using a zinc oxide (ZnO) target to which 2 wt % of alumina (Al$_2$O$_3$) was added. On the top of that, a photoelectric conversion layer 7 having a PIN junction was formed by forming an a-Si:H thin film by a plasma CVD method. Finally, the ITO film of Reference Example 23 was formed on the surface of the photoelectric conversion layer 7 as the first transparent conductive oxide film 8 until the thickness became 20 nm, after which the ITiO film Reference Example 5 was formed as the second transparent conductive oxide film 9 until the thickness became 100 nm, to form the layered film 10 as the transparent electrode 12.

The film formation condition of the first transparent conductive oxide film 8 was forming the film with one cathode in the same way as in Reference Example 23, and the film formation condition of the second transparent conductive oxide film 9 was forming the film by five cathodes in the same way is in Reference Example 5, however, the film thicknesses of the respective films were precisely controlled by the conveying speed. This series of film formation was performed by continuously conveying the substrate in a 1-pass inline sputtering method.

After that, a thin-film solar cell having a 5.0 mm square cell was made through necessary processes of a known technique.

Comparative Example 1

Except for not providing a first transparent conductive oxide film, and only forming a second transparent conductive oxide film on the surface of the photoelectric conversion layer 7 as a transparent electrode such that the film thickness became 120 nm, a thin-film solar cell was made under all of the same conditions as in Example 1.
[Evaluation]
Evaluation of the solar cell characteristics was performed by irradiating the obtained solar cell with AM-1 light using a solar simulator, and measuring the voltage-current characteristics, then the short-circuit current (Isc), the open-end voltage (Voc), the fill factor (FF), and the photoelectric conversion efficiency (η) were measured and relative comparisons were made.

In a solar cell, in the operating state, when both electrodes are open, a difference in the Fermi level arises due to the movement of carriers generated at the PN junction. The potential that corresponds to this difference in the Fermi level is the open-end voltage (Voc). In the operating state of a solar cell, the optical induced current that flows in the circuit when both electrodes are short circuited, and that is proportional to the amount of incident light is called the short-circuit current (Isc). The product of the open-end voltage (Voc) and the short-circuit current (Isc) is the ideal power value of the solar cell, and the fill factor (FF) represents the ratio of the power that can actually be taken out to the ideal power value. Therefore, the larger the values for the fill factor (FF) and the conversion efficiency (η) are, the more excellent the solar cell characteristics are.

The respective results are converted to relative values taking the value obtained in Comparative Example 1 to be 1.00, and those results are given in Table 3.

Example 1 that used the layered film of the present invention in which a second transparent conductive oxide film comprising ITiO film was layered after forming a first transparent conductive oxide film comprising ITO film having excellent conductivity on the surface of the photoelectric conversion film was such that the fill factor (FF) was increased and the conversion efficiency (η) was greatly improved compared with when only ITiO film was formed. The increase in the fill factor (FF) was due to the carriers that were generated in the photoelectric conversion layer efficiently flowing into the layered film via the ITO film having good conductivity. In other words, the loss due to the resistance of the "photoelectric conversion layer/first transparent conductive oxide film/second transparent conductive oxide film" of Example 1 is considered to be reduced compared to the loss due to the resistance of "photoelectric conversion layer/second transparent conductive oxide film" of Comparative Example 1 in which there is no first transparent conductive oxide film.

Examples 2 to 4

Except for changing the film thickness of the first transparent conductive oxide film 8 and second transparent conductive oxide film 9 while keeping the whole film thickness of the layered film 10 in Example 1 so that the film thickness of the first transparent conductive oxide film 8 became 3 nm (Example 2), 40 nm (Example 3), and 60 nm (Example 4), a thin-film solar cells were manufactured and evaluated in the same way as in Example 1. Similarly, the respective results are converted to relative values taking the value obtained in Comparative Example 1 to be 1.00, and those results are given in Table 3.
[Evaluation]
The thin-film solar cells of Examples 2 to 4 that used the layered film of the present invention were such that a first transparent conductive oxide film that included ITO film having good conductivity was formed on the surface of the photoelectric conversion layer, and when compared with Comparison Example 1, the fill factor (FF) was increased, and the conversion efficiency (η) was higher. The increase in the fill factor (FF) in Examples 2 to 4 is considered to be due to a decrease in the loss due to the resistance of the "photoelectric conversion layer/transparent electrode" when compared with Comparison Example 1.

The reason that the short-circuit current of Examples 3 and 4 is a little inferior to Comparison Example 1 is considered to be due to a small decrease in the amount of infrared light incident on the photoelectric conversion layer by way of the first transparent conductive oxide film. However, the large improvement in the fill factor (FF) contributes, and the conversion efficiency (η) increases.

Example 5 to 9, Comparative Example 2 to 6

As Examples 5 to 9, except for changing the film formation conditions (total pressure, distance between the target and substrate) of the first transparent conductive oxide film 8 and the second transparent conductive oxide film 9 in Example 1, film type, and film thickness, thin-film cells were manufactured in the same way as in Example 1. When doing this, the first transparent conductive oxide film 8 was formed on the photoelectric conversion layer 7 side.

As Comparison Examples 2 to 6, except for not providing a first transparent conductive oxide film, forming only a second first transparent conductive oxide film on the surface of the photoelectric conversion layer and making the film thickness the same as the total film thickness of the respective Examples 5 to 9, thin-film solar cells were manufactured under all of the same conditions Examples 5 to 9.

Similarly, the respective results are converted to relative values taking the value obtained in Comparative Example 1 to be 1.00, and those results are given in Table 3.
[Evaluation]
It is understood that in the cases of the thin-film solar cells of Examples 5 to 9, when compared with Comparison Examples 2 to 6, the respective fill factors (FF) were increased, and the conversion efficiencies (η) were improved. The increase in the fill factor (FF) is considered to be due to a decrease in the loss due to the resistance of the "photoelectric conversion layer/transparent electrode".

Comparative Example 7

As Comparative Example 7, except for not using a second transparent conductive oxide film that included ITiO film, and forming only first transparent conductive oxide film that included ITO film so that the film thickness became the same as the total film thickness (120 nm) in Example 1, a thin-film solar cell was manufactured by the same method as in Example 1.
[Evaluation]
In the case of the thin-film solar cell of Comparison Example 7 in which only a first transparent conductive oxide film that included ITO film was formed, when compared with Comparison Example 1 in which only a second transparent conductive oxide film that included ITiO film was formed, the fill factor (FF) increased, however, the conversion efficiency (η) became low due to a decrease in the short-circuit current (Isc) and open-end voltage (Voc). The increase in the fill factor (FF) is considered to be due to a decrease in the loss due to the resistance of the "photoelectric conversion layer/transparent electrode", however, the decrease in the short-circuit current (Isc) and open-end voltage (Voc) is considered to be due to a decrease in the amount of infrared light that is incident on the photoelectric conversion layer. Moreover, when compared with the thin-film solar cells of Examples 1 to 4, in the thin-film solar cell of Comparison Example 7, the short-circuit current (Isc) and open-end voltage (Voc) were decreased, and as a result the conversion efficiency (η) became low. The reason there is a decrease in the short-circuit current (Isc) and the open-end voltage (Voc) is similarly considered to be due to a decrease in the amount of infrared light that is incident on the photoelectric conversion layer.

Example 10

Layered film having the same configuration as that of Example 1 was formed in the same way as in Example 1 as a transparent electrode on top of a hybrid type photoelectric conversion layer that included amorphous thin-film silicon and single-crystal silicon, to make a hybrid solar cell.

As the solar cell characteristics, the short-circuit current (Isc), open-end terminal voltage (Voc), fill factor (FF), conversion efficiency (η) were each evaluated in the same way as in Example 1, and the tendencies were the same as those of Examples 1 to 9, and Comparative Examples 1 to 7, and by forming a first transparent conductive oxide film on the photoelectric conversion layer side, the fill factor (FF) was increased, and the conversion efficiency was improved.

Example 11

Layered film having the same configuration as that of Example 1 was formed in the same way as in Example 1 as a transparent electrode on top of a photoelectric conversion layer that included a compound semiconductor such as $CuInSe_2$, GaAs, CdTe and the like, to make a compound thin-film solar cell.

As the solar cell characteristics, the short-circuit current (Isc), open-end terminal voltage (Voc), fill factor (FF), conversion efficiency (η) were each evaluated in the same way as in Example 1, and the tendencies were the same as those of Example 1, and by forming a first transparent conductive oxide film on the photoelectric conversion layer side, the fill factor (FF) was increased, and the conversion efficiency was improved.

TABLE 3

| | Layered Transparent Conductive Oxide Film | | | | | | | |
|---|---|---|---|---|---|---|---|---|
| | First transparent conductive oxide film | | Second transparent conductive oxide film | | | | | |
| | Type, Conditions | Film thickness (nm) | Type, Conditions | Film thickness (nm) | Short-circuit current Isc | Open-end voltage Voc | Fill Factor FF | Conversion efficiency η |
| Ex 1 | RE 23 | 20 | RE 5 | 100 | 1.00 | 1.00 | 1.12 | 1.16 |
| CE 1 | None | | RE 5 | 120 | 1.00 | 1.00 | 1.00 | 1.00 |
| Ex 2 | RE 23 | 3 | RE 5 | 117 | 1.00 | 1.00 | 1.06 | 1.08 |
| Ex 3 | RE 23 | 40 | RE 5 | 80 | 0.99 | 1.00 | 1.11 | 1.15 |
| Ex 4 | RE 23 | 60 | RE 5 | 60 | 0.98 | 1.00 | 1.11 | 1.15 |
| Ex 5 | RE 22 | 10 | RE 4 | 90 | 1.00 | 1.00 | 1.04 | 1.04 |
| CE 2 | None | | RE 4 | 100 | 1.00 | 1.00 | 1.00 | 1.00 |
| Ex 6 | RE 27 | 10 | RE 12 | 60 | 1.00 | 1.01 | 1.06 | 1.08 |
| CE 3 | None | | RE 12 | 70 | 1.00 | 1.00 | 1.00 | 1.00 |
| Ex 7 | RE 34 | 30 | RE 16 | 110 | 0.99 | 1.01 | 1.07 | 1.09 |
| CE 4 | None | | RE 16 | 140 | 1.00 | 1.00 | 1.00 | 1.00 |
| Ex 8 | RE 37 | 20 | RE 10 | 60 | 1.00 | 1.00 | 1.04 | 1.05 |
| CE 5 | None | | RE 10 | 80 | 1.00 | 1.00 | 1.00 | 1.00 |
| Ex 9 | RE 31 | 3 | RE 7 | 67 | 1.00 | 1.01 | 1.05 | 1.07 |
| CE 6 | None | | RE 7 | 70 | 1.00 | 1.00 | 1.00 | 1.00 |
| CE 7 | RE 23 | 120 | None | | 0.88 | 0.98 | 1.05 | 0.95 |

*Ex: Example;
*CE: Comparative Example;
*RE: Reference Example
*The short-circuit current, the open-end voltage, the fill factor, and the conversion efficiency are all relative values with respect to Comparison Example 1.

EXPLANATION OF REFERENCE NUMBERS

1 Substrate
2 Target
3, 3a Sputtered particles
4 Distance between target and substrate
5 ITO target
6 ITiO target
7 Photoelectric conversion layer
8 First transparent conductive oxide film (ITO film, IO film)
9 Second transparent conductive oxide film (ITiO) film
10 Layered transparent conductive oxide film (transparent electrode)
11 Glass substrate (transparent substrate)
12 Front-side (light-receiving side) transparent electrode
13 P layer
14 I layer
15 N layer
16 Rear-side transparent electrode film (contact improving layer)
17 Rear-surface electrode
18 p-type semiconductor light-absorbing layer 19 Semiconductor intermediate layer
20 Window layer
21 Center of target
22 Position of the substrate surface directly above the center of the target
23 Position of the substrate surface that is separated 15 cm from directly above the center of the target
24 Barrier layer

The invention claimed is:

1. A transparent conductive oxide film that is used as a transparent electrode in a photoelectric conversion element that comprises at least a photoelectric conversion layer and the transparent electrode;
the transparent conductive oxide film comprising a layered film that includes:
a first transparent conductive oxide film comprising an indium oxide or a tin-containing indium oxide that includes indium oxide as a main component and tin at an atomic ratio Sn/(In+Sn) of 19 atomic % or less, and formed directly on a photoelectric conversion layer side; and
a second transparent conductive oxide film comprising a titanium-containing indium oxide that includes indium oxide as a main component, and titanium at an atomic ratio Ti/(In+Ti) of 0.5 atomic % to 3.5 atomic %, is layered directly on the first transparent conductive oxide film and laminated on an opposite side of the photoelectric conversion layer.

2. The transparent conductive oxide film according to claim 1, wherein the film thickness of the first transparent conductive oxide film is within the range 3 nm to 60 nm, and the film thickness of the overall layered film is within the range 70 nm to 140 nm.

3. The transparent conductive oxide film according to claim 1 wherein both the first transparent conductive oxide film and second transparent conductive oxide film are crystalline films.

4. The transparent conductive oxide film according to claim 1, wherein the first transparent conductive oxide film and second transparent conductive oxide film are formed by a sputtering method.

5. The transparent conductive oxide film according to claim 4, wherein the sputtering method is an inline-type sputtering method.

6. A photoelectric conversion element that comprises at least a photoelectric conversion layer and a transparent electrode, and wherein the transparent conductive oxide film according to claim 1 is used as the transparent electrode.

7. The photoelectric conversion element according to claim 6, wherein a silicon type semiconductor or a compound semiconductor is used in the photoelectric conversion layer.

8. A method for manufacturing a photoelectric conversion element that comprises at least a photoelectric conversion layer and transparent electrode, and comprising processes of:
conveying the photoelectric conversion layer as a substrate;
using an inline-type sputtering method to form directly a first transparent conductive oxide film comprising an indium oxide or a tin-containing indium oxide that includes indium oxide as a main component and tin at an atomic ratio Sn/(In+Sn) of 19 atomic % or less on the photoelectric conversion layer that is being conveyed as the substrate;
using an inline-type sputtering method to form directly a second transparent conductive oxide film comprising a titanium-containing indium oxide that includes indium oxide as a main component, and titanium at an atomic ratio Ti/(In+Ti) of 0.5 atomic % to 3.5 atomic %, is layered on top of the first transparent conductive oxide film that is formed on the photoelectric conversion layer that is being conveyed as the substrate; and
obtaining a photoelectric conversion element wherein a layered film comprising the first transparent conductive oxide film that is formed directly on the photoelectric conversion layer side, and the second transparent conductive oxide film that is formed directly on top of the first transparent conductive oxide film is formed as the transparent electrode.

9. Method for manufacturing a photoelectric conversion element that comprises at least a transparent substrate, a photoelectric conversion layer and a transparent electrode, and comprising steps of:
conveying the transparent substrate;
using an inline-type sputtering method to form a second transparent conductive oxide film comprising a titanium-containing indium oxide that includes indium oxide as a main component, and titanium at an atomic ratio Ti/(In+Ti) of 0.5 atomic % to 3.5 atomic % on the transparent substrate that is being conveyed;
using an inline-type sputtering method to form directly a first transparent conductive oxide film comprising an indium oxide or a tin-containing indium oxide that includes indium oxide as a main component and tin at an atomic ratio Sn/(In+Sn) of 19 atomic % or less on the second transparent conductive oxide film that is formed on the transparent substrate that is being conveyed;
forming directly a photoelectric conversion layer on top of the first transparent conductive oxide film; and
obtaining a photoelectric conversion element wherein a layered film comprising the first transparent conductive oxide film that is formed directly on the photoelectric conversion layer side, and the second transparent conductive oxide film that is layered directly on the first transparent conductive oxide film and laminated on an opposite side of the photoelectric conversion layer is formed as the transparent electrode.

* * * * *